United States Patent
Park et al.

(10) Patent No.: US 9,190,128 B2
(45) Date of Patent: Nov. 17, 2015

(54) SEMICONDUCTOR DEVICE

(71) Applicant: SK hynix Inc., Gyeonggi-do (KR)

(72) Inventors: Ga-Ram Park, Gyeonggi-do (KR); Jae-Il Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/487,974

(22) Filed: Sep. 16, 2014

(65) Prior Publication Data
US 2015/0294701 A1 Oct. 15, 2015

(30) Foreign Application Priority Data
Apr. 15, 2014 (KR) .......................... 10-2014-0044811

(51) Int. Cl.
*G11C 7/00* (2006.01)
*G11C 7/22* (2006.01)
*G11C 7/10* (2006.01)

(52) U.S. Cl.
CPC ............ *G11C 7/22* (2013.01); *G11C 7/106* (2013.01); *G11C 7/1054* (2013.01)

(58) Field of Classification Search
CPC ........ G11C 7/1051; G11C 7/1078; G11C 7/22
USPC .................... 365/189.05, 193, 194
See application file for complete search history.

(56) References Cited

U.S. PATENT DOCUMENTS

2007/0071074 A1\* 3/2007 Shin ...................... G11C 7/1012
　　　　　　　　　　　　　　　　　　　　　　　375/150
2012/0106276 A1\* 5/2012 Kim ...................... G11C 29/022
　　　　　　　　　　　　　　　　　　　　　　　365/193
2013/0083609 A1\* 4/2013 Dono ................... G11C 7/1057
　　　　　　　　　　　　　　　　　　　　　　　365/189.05

FOREIGN PATENT DOCUMENTS

KR　　1020090103497　　10/2009
KR　　1020110060513　　6/2011
KR　　　101187639　　10/2012

\* cited by examiner

*Primary Examiner* — Son Dinh
(74) *Attorney, Agent, or Firm* — IP & T Group LLP

(57) ABSTRACT

A semiconductor device includes a first buffer suitable for receiving and buffering data, a second buffer suitable for receiving and buffering a data strobe signal, a strobe line suitable for transferring the data strobe signal; a plurality of data transfer lines suitable for transferring data inputted at corresponding turns among data inputted in series through the first buffer, a latch signal generation block suitable for generating a plurality of latch signals which are sequentially activated, based on the data strobe signal transferred through the strobe line, a data latch block suitable for latching and aligning in parallel the data inputted in series through the first buffer, based on the latch signals, and a data transfer block suitable for transferring the data latched by the data latch block to the plurality of data transfer lines, according to a correspondence relationship determined based on an input start signal that is activated at a time when the input of data corresponding to the data input command is started.

23 Claims, 14 Drawing Sheets

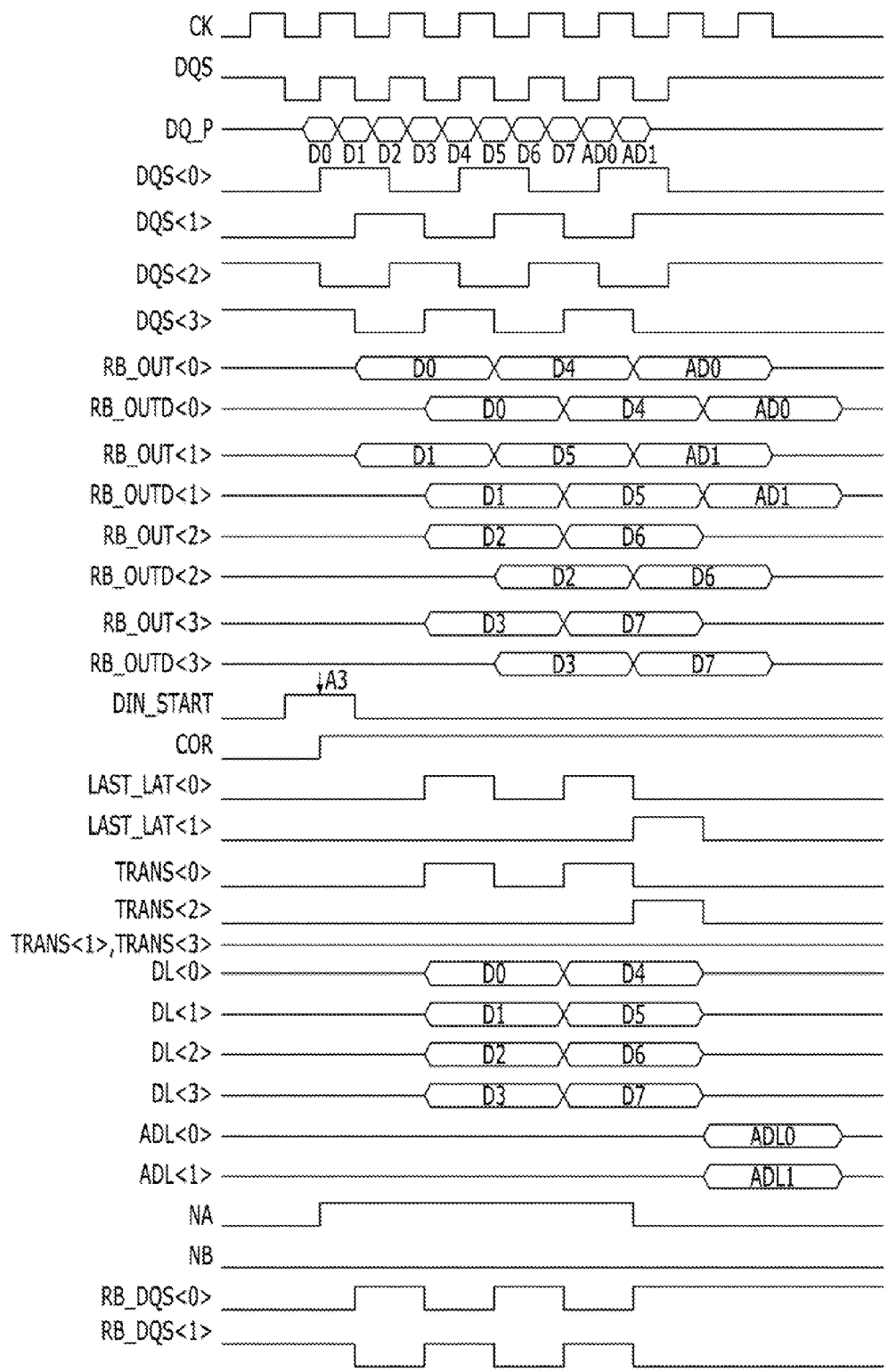

SEMICONDUCTOR DEVICE

CROSS-REFERENCE TO RELATED APPLICATIONS

The present application claims priority of Korean Patent Application No. 10-2014-0044811, filed on Apr. 15, 2014, which is incorporated herein by reference in its entirety.

BACKGROUND

1. Field

Various embodiments of the present invention relate to a semiconductor device.

2. Description of the Related Art

A semiconductor memory device receives a data strobe signal together with data transferred from a memory controller. The data strobe signal is an echo signal for synchronizing the semiconductor memory device and the memory controller when the data is transferred there between, and ensures stable transmission of the data. After the semiconductor memory device has received the data, the semiconductor memory device aligns in parallel the data, which have been transmitted in series, and transfers and stores the aligned data to and in an internal circuit, for example, a cell array.

The internal circuit operates in synchronization with a clock signal, which is applied together with a command and an address from the memory controller. Since the clock signal and the data strobe signal are inputted to the semiconductor memory device through different paths, a phase difference between the clock signal and the data strobe signal may occur. Therefore, to process the inputted data in the semiconductor memory device, the data, which is inputted in synchronization with the data strobe signal, and the clock signal should be synchronized with each other.

SUMMARY

Various embodiments are directed to a semiconductor device that may align in parallel data inputted in series by using a data strobe signal, thereby decreasing a jitter and increasing a setup/hold margin.

Furthermore, various embodiments are directed to a semiconductor device that may prevent invalid data from being transferred, through ringback control, even when noise is generated in a data strobe signal.

In an embodiment of the present invention, a semiconductor device may include: a first buffer suitable for receiving and buffering data, a second buffer suitable for receiving and buffering a data strobe signal, a strobe line suitable for transferring the data strobe signal; a plurality of data transfer lines suitable for transferring data inputted at corresponding turns among data inputted in series through the first buffer, a latch signal generation block suitable for generating a plurality of latch signals which are sequentially activated, based on the data strobe signal transferred through the strobe line, a data latch block suitable for latching and aligning in parallel the data inputted in series through the first buffer, based on the latch signals, and a data transfer block suitable for transferring the data latched by the data latch block to the plurality of data transfer lines, according to a correspondence relationship determined based on an input start signal that is activated at a time when the input of data corresponding to the data input command is started.

In an embodiment of the present invention, a semiconductor device may include: a first buffer suitable for receiving and buffering data, a second buffer suitable for receiving and buffering a data strobe signal, a strobe line suitable for transferring the data strobe signal, a plurality of data transfer lines suitable for transferring data inputted at corresponding turns among data inputted in series through the first buffer, a latch signal generation block suitable for generating a plurality of latch signals, which are sequentially activated, by using the data strobe signal transferred through the strobe line, a ringback latch signal generation block suitable for generating at least one ringback latch signal, which is activated during a period corresponding to a time during which data corresponding to a data input command is inputted, based on at least one latch signal among the latch signals, a first data latch block suitable for latching and aligning in parallel the data inputted in series through the first buffer, based on the latch signals a second data latch block suitable for latching data outputted from the first data latch block, based on the at least one ringback latch signal, and a data transfer block suitable for transferring the data latched by the second data latch block, to a plurality of data transfer lines, according to a correspondence relationship determined based on an input start signal that is activated at a time when the input of data corresponding to the data input command is started.

BRIEF DESCRIPTION OF THE DRAWINGS

FIGS. 10A to 10D are waveform diagrams for describing operations of the semiconductor device shown in FIG. 8.

DETAILED DESCRIPTION

Figure 1:
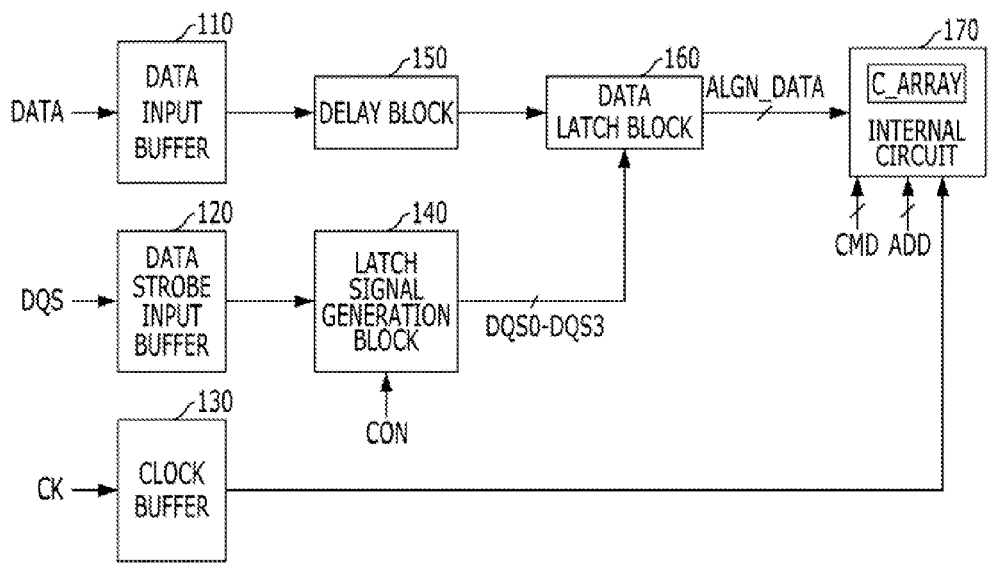
FIG. 1 is a block diagram illustrating a semiconductor device that serially receives, aligns in parallel and transfers data.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

In the drawings a thicknesses and length of components are exaggerated compared to actual physical thickness and intervals for convenience of illustration. In the following description, a detailed explanation of known related functions and constitutions may be omitted to avoid unnecessarily obscuring the subject manner of the present invention. Furthermore, "connected/coupled" represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exist or are added.

FIG. 1 is a block diagram illustrating a semiconductor device that serially receives, aligns in parallel and transfers data.

As shown in FIG. 1, the semiconductor device may include a data input buffer 110, a data strobe input buffer 120, a clock buffer 130, a latch signal generation block 140, a delay block 150, a data latch block 160, and an internal circuit 170.

The data input buffer 110, the data strobe input buffer 120 and the clock buffer 130 receive and buffer data, a data strobe signal DQS and a clock signal CK, respectively.

The latch signal generation block 140 may divide the data strobe signal DQS and generate a plurality of latch signals DQS0 to DQS3 which are sequentially activated. The latch signal generation block 140 may generate the latch signals DQS0 to DQS3 in response to a control signal CON which is generated in synchronization with the clock signal CK in the semiconductor device. Accordingly, the latch signals DQS0 to DQS3 may be signals which are synchronized with the clock signal CK.

The data DATA which are inputted through the data input buffer 110 may be delayed through the delay block 150 and be transferred to the data latch block 160. The delay block 150 may have a delay value that models the delay value induced in the latch signal generation block 140. This is to match the phases of the data and the latch signals DQS0 to DQS3 in the data latch block 160.

The data latch block 160 may latch and align in parallel the data DATA in response to the latch signals DQS0 to DQS3, and output aligned data ALGN_DATA. Since the latch signals DQS0 to DQS3 are signals which are synchronized with the clock signal CK, the phases of the aligned data ALGN_DATA may be synchronized with the clock signal CK.

The internal circuit 170 may include a cell array C_ARRAY which includes a plurality of memory cells (not shown), and may process the aligned data ALGN_DATA in synchronization with the clock signal CK in response to a command CMD and an address ADD. For example, when the command CMD is a write command, the internal circuit 170 may write the aligned data ALGN_DATA in memory cells which are selected by the address ADD among the memory cells included in the cell array C_ARRAY in response to the command CMD.

Figure 2:
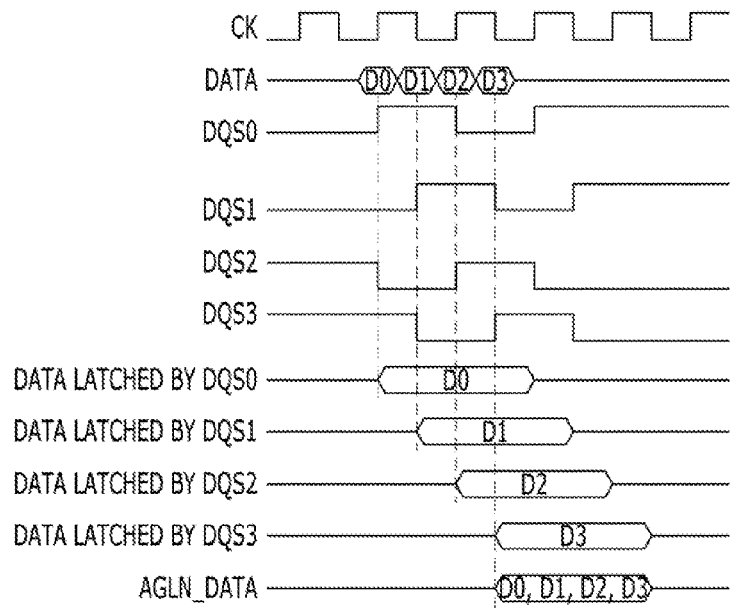
FIG. 2 is a waveform diagram of the semiconductor device shown in FIG. 1.

FIG. 2 is a waveform diagram of the semiconductor device shown in FIG. 1. FIG. 2 illustrates 4 units of data D0 to D3 inputted in series then are aligned in parallel.

As shown in FIG. 2, the data D0 to D3 inputted in series are latched by the latch signals DQS0 to DQS3 which are synchronized with the clock signal CK, and may be outputted by being aligned with the phase of the latch signal DQS3.

The delay value of the delay block 150 may vary according to the operating conditions, for example, process, voltage and temperature (PVT) conditions, of the semiconductor device. Due to this fact, a jitter may occur, and a setup/hold margin may deteriorate.

Figure 3:
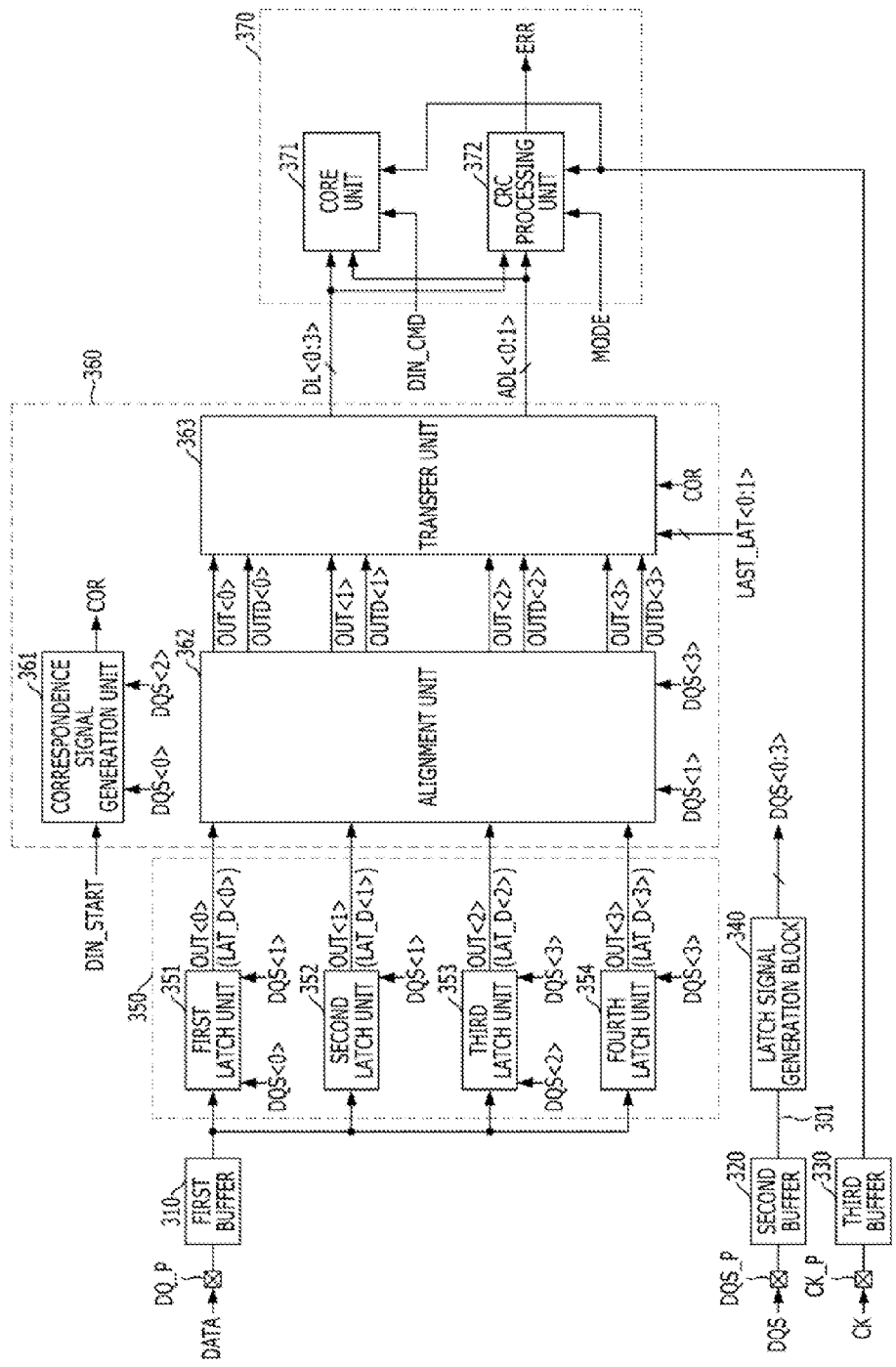
FIG. 3 is a block diagram illustrating a semiconductor device in accordance with an embodiment of the present invention.

FIG. 3 is a block diagram illustrating a semiconductor device in accordance with an embodiment of the present invention.

As shown in FIG. 3, the semiconductor device may include a first buffer 310, a second buffer 320, a third buffer 330, a latch signal generation block 340, a data latch block 350, a data transfer block 360, a plurality of data transfer lines DL<0:3> and ADL<0:1>, and an internal circuit 370.

Hereinbelow, descriptions are made for a semiconductor device aligning in parallel the data inputted in series through a data pad DQ_P, by the unit of 4, and transferring the aligned data to 4 data transfer lines DL<0:3> and, if 2 additional data are inputted through the data pad DQ_P, the semiconductor device aligns in parallel the additional data and transfers the aligned additional data to 2 additional data transfer lines ADL<0:1>. The numbers of the data inputted in series, the data transfer lines and the additional data transfer lines may be changed according to a design.

The first buffer 310 may buffer and output data DATA which are inputted through the data pad DQ_P. The second buffer 320 may buffer and output a data strobe signal DQS which is inputted through a data strobe pad DQS_P. The third buffer 330 may buffer and output a clock signal CK which is inputted through a clock pad CK_P. The cycles of the data strobe signal DQS and the clock signal CK may be the same.

The latch signal generation block 340 may generate a plurality of latch signals DQS<0:3> which are sequentially activated, by using the data strobe signal DQS outputted from the second buffer 320. The latch signal generation block 340 may generate a first latch signal DQS<0> which is synchronized with the first rising edge of the data strobe signal DQS outputted from the second buffer 320, a second latch signal DQS<1> which is synchronized with the first falling edge of the data strobe signal DQS, a third latch signal DQS<2> which is synchronized with the second rising edge of the data strobe signal DQS, and a fourth latch signal DQS<3> which is synchronized with the second falling edge of the data strobe signal DQS. The cycles of the latch signals DQS<0:3> may be two times the cycle of data strobe signal DQS. The data strobe signal DQS may be transferred to the latch signal generation block 340 through a strobe line 301. One end of the strobe line 301 may be directly connected to the second buffer 320, and the other end of the strobe line 301 may be directly connected to the latch signal generation block 340. The strobe line 301 may be a conductive line which does not include any delay element for a signal, except parasitic components such as parasitic resistance and parasitic capacitance.

The data latch block 350 may latch the data inputted in series through the first buffer 310, in response to the latch signals DQS<0:3>. The data latch block 350 may include a plurality of output terminals OUT<0:3> respectively corresponding to the latch signals DQS<0:3>, and may output data LAT_D<0:3> which are latched by the latch signals DQS<0:3>, to the output terminals OUT<0:3> corresponding to the latch signals DQS<0:3>. The first to fourth output terminals OUT<0> to OUT<3> may respectively correspond to the first to fourth latch signals DQS<0> to DQS<3>. The data latch block 350 may output the data latched by the first latch signal DQS<0>, to the first output terminal OUT<0>, may output the data latched by the second latch signal DQS<1>, to the second output terminal OUT<1>, may output the data latched by the third latch signal DQS<2>, to the third output terminal OUT<2>, and may output the data latched by the fourth latch signal DQS<3>, to the fourth output terminal OUT<3>.

For these operations, the data latch block 350 may include first to fourth latch units 351 to 354. The first latch unit 351 may latch data in response to the first latch signal DQS<0> and may output the latched data LAT_D<0> to the first output terminal OUT<0> in alignment with the second latch signal DQS<1>. The second latch unit 352 may latch data in response to the second latch signal DQS<1>, and may output the latched data LAT_D<1> to the second output terminal OUT<1>. The third latch unit 353 may latch data in response to the third latch signal DQS<2>, and may output the latched data LAT_D<2> to the third output terminal OUT<2> in alignment with the fourth latch signal DQS<3>. The fourth latch unit 354 may latch data in response to the fourth latch signal DQS<3>, and may output the latched data LAT_D<3> to the fourth output terminal OUT<3>.

The data transfer lines DL 0:3> and ADL<0:1> may include first to fourth data transfer lines DL<0> to DL<3> and first and second additional data transfer lines ADL<0> and ADL<1>. The semiconductor device shown in FIG. 3 may be inputted in series with data by a number which is a multiple of 4 through the data pad DQ_P, and may then be inputted in series with additional data. The first to fourth data transfer lines DL<0> to DL<3> may transfer the data inputted at corresponding turns among the data inputted in series through the first buffer 310. The first and second additional data transfer lines ADL<0> and ADL<1> may respectively transfer the additional data inputted first and the additional data inputted second.

Hereinbelow, descriptions are made for when 8 data and 2 additional data are inputted in series that correspond to a one time data input command DIN_CMD. The first data transfer line DL<0> may transfer the data inputted at a 4*N×3 (N=1 or 2) turn, the second data transfer line DL<1> may transfer the data inputted at a 4*N−2$^{th}$ turn, the third data transfer line DL<2> may transfer the data inputted at a 4*N×1$^{th}$ turn, and the fourth data transfer line DL<3> data transfer lire ADL<0> may transfer the additional data inputted first after the above-described 8 data are inputted, and the second additional data transfer line ADL<1> may transfer the additional data inputted second.

That is, the data inputted in series through the data pad DQ_P should be transferred to corresponding data transfer lines according to the input turns thereof, regardless of which latch signals the data are latched. The data transfer block 360 may transfer the data outputted from the data latch block 350, to the data transfer lines DL<0:3> and ADL<0:1>, according to a predetermined correspondence relationship.

The data transfer block 360 may transfer the data latched by the data latch block 350, to the data transfer lines DL<0:3> and ADL<0:1>, according to a correspondence relationship that is determined in response to an input start signal DIN_START, which is activated at the time when the input of the data corresponding to the data input command DIN_CMD is started.

When the input start signal DIN_START is latched by the first latch signal DQ<0>, the data transfer block 360 may transfer the data outputted through the first output terminal OUT<0>, to the first data transfer line DL<0>, may transfer the data outputted through the second output terminal OUT<1>, to the second data transfer line DL<1>, may transfer the data outputted through the third output terminal OUT<2>, to the third data transfer line DL<2>, and may transfer the data outputted through the fourth output terminal OUT<3>, to the fourth data transfer line DL<3>. For additional data, the data transfer block 360 may transfer the data outputted through the first output terminal OUT<0>, to the first additional data transfer line ADL<0> and may transfer the data outputted through the second output terminal OUT<1> to the second additional data transfer line ADL<1>.

Further, when the input start signal DIN_START is latched by the third latch signal DQS<2>, the data transfer block 360 may transfer the data outputted through the third output terminal OUT<2>, to the first data transfer line DL<0>, may transfer the data outputted through the fourth output terminal OUT<3>, to the second data transfer line DL<1>, may transfer the data outputted through the first output terminal OUT<0>, to the third data transfer line DL<2>, and may transfer the data outputted through the second output terminal OUT<1>, to the fourth data transfer line DL<3>. For additional data, the data transfer block 360 may transfer the data outputted through the third output terminal OUT<2>, to the first additional data transfer line ADL<0> and may transfer the data outputted through the fourth output terminal OUT<3>, to the second additional data transfer line ADL<1>.

The input start signal DIN_START may be a pulse signal which is activated 0.5 clock before the data corresponding to the data input command DIN_CMD is inputted to the data pad DQ_P after the data input command DIN_CMD is inputted, in consideration of a latency, and which has an activation period of 1 clock. Accordingly, when the input start signal DIN_START is latched by the first latch signal DQS<0>, the data inputted at a 4*N×3$^{th}$ turn through the data pad DQ_P may be data which is latched by the first latch signal DQS<0>, and when the input start signal DIN_START is latched by the third latch signal DQS<2>, the data inputted at a 4*N×3$^{th}$ turn through the data pad DQ_P may be data which is latched by the third latch signal DQS<2>. Therefore, by transferring the data outputted from the data latch block 350 in the above-described correspondence relationship, the data inputted at corresponding turns may always be loaded on the data transfer lines DL<0:3> and ADL<0:1>.

The data transfer block 360 may align in parallel the data outputted from the data latch block 350, based on a time when finally latched data among the data latched by the data latch block 350 is latched. For example, when the data latched by the first latch signal DQS<0> among the data latched by the data latch block 350 is first latched data, since the data latched by the fourth latch signal DQS<3> is fourth latched data (that is, finally latched data), the data transfer block 360 may align and output the latched data based on a time when the fourth latch signal DQS<3> is activated. Further, when the data latched by the third latch signal DQS<2> among the data latched by the data latch block 350 is first latched data, since the data latched by the second latch signal DQS<1> is fourth latched data (that is, finally latched data), the data transfer block 360 may align and output the latched data based on a time when the second latch signal DQS<1> is activated. Thus, the data transferred to the first to fourth data transfer lines DL<0:3> may be aligned according to turns at which they are inputted, and may have the same phase.

To perform the above-described operations, the data transfer block 360 may include a correspondence signal generation unit 361, an alignment unit 362, and a transfer unit 363. The correspondence signal generation unit 361 may generate a correspondence signal COR which has a first logic value when the input start signal DIN_START is latched by the first latch signal DQS<0> and a second logic value when the input start signal DIN_START is latched by the third latch signal DQS<2 When the input start signal DIN_START is latched by the first latch signal DQS<0>, the data inputted at a 4N−3$^{th}$ turn among the data inputted through the data pad DQ_P may be latched by the first latch signal DQS<0>, and when the input start signal DIN_START is latched by the third latch signal DQS<2, the data inputted at a 4N−3$^{th}$ turn among the data inputted through the data pad DQ_P may be latched by the third latch signal DQS<2>.

The alignment unit 362 may align and output the data of the first to fourth output terminals OUT<0:3> in synchronization with the fourth latch signal DQS<3> and the second latch signal DQS<1>, The alignment unit 362 may align the data of the first and second output terminals OUT<0> and OUT<1> in response to the fourth latch signal DQS<3>, and output data OUTD<0> and OUTD<1>. Also, the alignment unit 362 may align the data of the third and fourth output terminals OUT<2> and OUT<3> in response to the second latch signal DQS<1>, and output data OUTD<2> and OUTD<3>. Therefore, the data OUTD<0> and OUTD<1> may be data which are latched by the first and second latch signals DQS<0> and DQS<1> and are aligned by the fourth latch signal DQS<3>. Also, the data OUTD<2> and OUTD<3> may be data which are latched by the third and fourth latch signals DQS<2> and DQS<3> and are aligned by the second latch signal DQS<1>.

The transfer unit 363 may transfer the data of the first to fourth output terminals OUT<0> to OUT<3> to the first to fourth data transfer lines DL<0> to DL<3>, respectively, when the correspondence signal COR has the first logic value, and may transfer the data of the first to fourth output terminals OUT<0> to OUT<3> to the third and fourth data transfer lines DL 2> and DL<3> and the first and second data transfer lines DL<0> and DL<1, respectively, when the correspondence signal COR has the second logic value.

Furthermore, when transferring the additional data inputted through the first buffer 310, the transfer unit 363 may transfer the data of the first and second output terminals OUT<0> and OUT<1> to the first and second additional data transfer lines ADL<0> and ADL<i> when the correspondence signal COR has the first logic value, and may transfer the data of the third and fourth output terminals OUT<2> and OUT<3> to the first and second additional data transfer lines ADL<0> and ADL<1> when correspondence signal COR has the second logic value.

The internal circuit 370 may operate in synchronization with the dock signal CK which is inputted through the third buffer 330, and may process the data transferred through the data transfer lines DL<0:3> and ADL<0:1>, in response to the data input command DIN_CMD. Processing of the data may mean storing of the data of the data transfer lines DL<0:3> and ADL<0:1>. For example, the semiconductor device shown in FIG. 3 may be a DRAM, and the data input command DIN_CMD may be a write command that causes the DRAM to write inputted data in memory cells. The additional data transferred through the additional data transfer lines ADL<0:1> may be cyclic redundancy check (CRC) data, for example, CRC codes, used to perform a cyclic redundancy check (CRC) for the data stored in the internal circuit 370 through the data transfer lines DL<0:3>.

The internal circuit 370 may include a core unit 371 which includes a plurality of memory cells (not shown) and a CRC processing unit 372. The CRC processing unit 372 may check an error in the data of the data transfer lines DL<0:3> through a CRC operation based on the data of the additional data transfer lines ADL<0:1> when a mode signal MODE is activated, in response to the mode signal MODE which is activated when performing the CRC operation, and may output a result ERR. The core unit 371 may store the data of the data transfer lines DL<0:3> and ADL<0:1> in response to the data input command DIN_CMD.

The semiconductor device shown in FIG. 3 may align data in parallel, by using only the data strobe signal DQS, until data are transferred to the data transfer lines DL<0:3> and ADL<0:1>. Therefore, it may be possible to cause the data which is inputted in a predetermined order to be transferred to corresponding data transfer lines, by using the correspondence signal COR which is generated using the data strobe signal DQS, regardless of which latch signal the data inputted at a certain turn, for example, the data inputted at a $4*N-3^{th}$ turn, is latched. Therefore, unlike the semiconductor device described above with reference to FIGS. 1 and 2, since delay for compensating for the phase difference between the data strobe signal DQS and the clock signal CK may not be used when aligning data in parallel, a jitter may be decreased and a setup/hold margin may be increased, thereby enabling a high speed operation.

Figure 4:
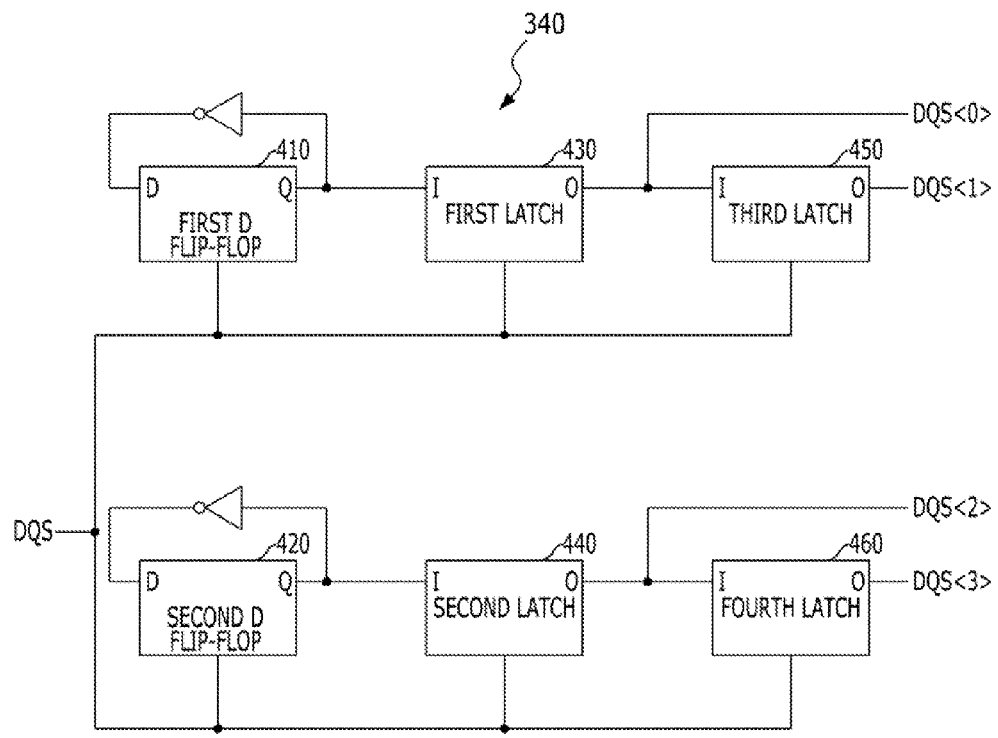
FIG. 4 is a detailed diagram of a latch signal generation block shown in FIG. 3.

FIG. 4 is a detailed diagram of the latch signal generation block 340 shown in FIG. 3.

As shown in FIG. 4, the latch signal generation block 340 may include D flip-flops 410 and 420, and latches 430 to 460.

A first D flip-flop 410 may store a value inputted to an input terminal D at the rising edge of the data strobe signal DQS, and output the value to an output terminal Q. An initial value stored and outputted by the first D flip-flop 410 may be a low logic level, that is, "0". A second D flip-flop 420 may store a value inputted to an input terminal D at the rising edge of the data strobe signal DQS, and output the value to an output terminal Q. An initial value stored and outputted by the second D flip-flop 420 may be a high logic level, that is, "1".

Each of first and second latches 430 and 440 may output a value inputted to an input terminal I at the rising edge of the data strobe signal DQS, to an output terminal O, and retain the output value till the next rising edge. Each of third and fourth latches 450 and 460 may output a value inputted to an input terminal I at the falling edge of the data strobe signal DQS, to an output terminal O, and retain the output value till the next falling edge.

The first D flip-flop 410 may store a value inputted to the input terminal D at the first rising edge of the data strobe signal DQS (for example, a high logic level acquired by inverting the value outputted from the output terminal Q), and output the value to the output terminal Q. The first latch 430 receives and outputs the output value of the first D flip-flop 410 at the ruing edge of the data strobe signal DQS, and retains the value till the next rising edge of the data strobe signal DQS. Accordingly, the first latch signal DQS<0> may be a signal which is activated at the first rising edge of the data strobe signal DQS and toggles at each rising edge of the data strobe signal DQS.

The third latch 450 may receive and output the first latch signal DQS<0> at the falling edge of the data strobe signal DQS, and retain the value till the next falling edge. Therefore, the high logic level outputted from the first D flip-flop 410 is transferred as the second latch signal DQS<1> at the next falling edge of the first rising edge (that is, at the first falling edge), and the second latch signal DQS<1> may be a signal which is activated at the first falling edge of the data strobe signal DQS and toggles at each falling edge of the data strobe signal DQS.

The second D flip-flop 420 may store a value inputted to the input terminal D at the first rising edge of the data strobe signal DQS (for example, a low logic level acquired by inverting the value outputted from the output terminal Q), and output the value to the output terminal Q. Also, the second D flip-flop 420 may store a high logic level inputted to the input terminal D at the second rising edge of the data strobe signal DQS, and output the value to the output terminal Q. The second latch 440 receives and outputs the output value of the second D flip-flop 420 at the rising edge of the data strobe signal DQS, and retains the value till the next rising edge of the data strobe signal DQS. Accordingly, the third latch signal DQS<2> may be a signal which is activated at the second rising edge of the data strobe signal DQS and toggles at each rising edge of the data strobe signal DQS.

The fourth latch 460 may receive and output the third latch signal DQS<2> at the falling edge of the data strobe signal DQS, and retain the value till the next falling edge. Therefore, the high logic level outputted from the second D flip-flop 420 is transferred as the fourth latch signal DQS<3> at the next falling edge of the second rising edge (that is, at the second falling edge), and the fourth latch signal QQS<3> may be a signal which is activated at the second falling edge of the data strobe signal DQS and toggles at each falling edge of the data strobe signal DQS.

As described above, the latch signal generation block 340 may generate the first to fourth latch signals DQS<0:3> which are respectively synchronized with the first rising edge, the first falling edge, the second rising edge and the second failing edge of the data strobe signal DQS and have a cycle two times longer than the data strobe signal DQS, by using only the data strobe signal DQS.

Figure 5:
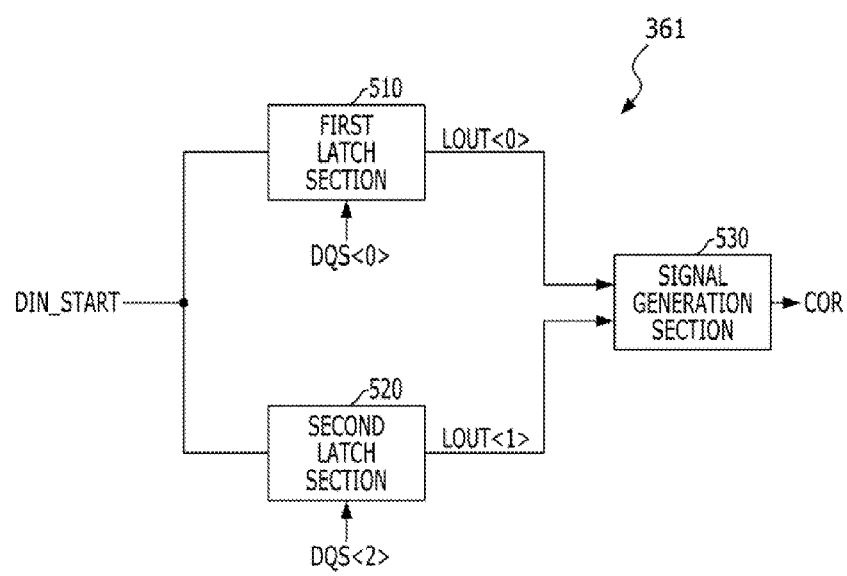
FIG. 5 is a detailed diagram of a correspondence signal generation unit shown in FIG. 3.

FIG. 5 is a detailed diagram of the correspondence signal generation unit 361 shown in FIG. 3.

As shown in FIG. 5, the correspondence signal generation unit 361 may include a first latch section 510, a second latch section 520, and a signal generation section 530.

The first latch section 510 may latch the input start signal DIN_START in response to the first latch signal DQS<0>, and output a result thereof as an output LOUT<0>. The first latch section 510 may activate the output LOUT<0> when the input start signal DIN_START is latched by the first latch signal DQS<0>.

The second latch section 520 may latch the input start signal DIN_START in response to the third latch signal DQS<2>, and output a result thereof as an output LOUT<1>. The second latch section 520 may activate the output LOUT<1> when the input start signal DINSTART is latched by the third latch signal DQS<2>.

The signal generation section 530 may generate the correspondence signal COR in response to the output LOUT<0> of the first latch section 510 and the output LOUTS 1> of the second latch section 520. The signal generation section 530 may set the logic value of the correspondence signal COR to a first value when the output LOUT<0> of the first latch section 510 is activated, and may set the logic value of the correspondence signal COR to a second value when the output LOUT<1> of the second latch section 520 is activated. The signal generation section 530 may include a RS latch for receiving one of the outputs LOUT<0> and LOUT<1> through a set input terminal and receiving the other through a reset input terminal. For example, the RS latch receives the output LOUT<0> through a set input terminal and receives the output LOUT<1> through a reset input terminal, when the first logic value is a high logic level and the second logic value is a low logic level.

Figure 6:
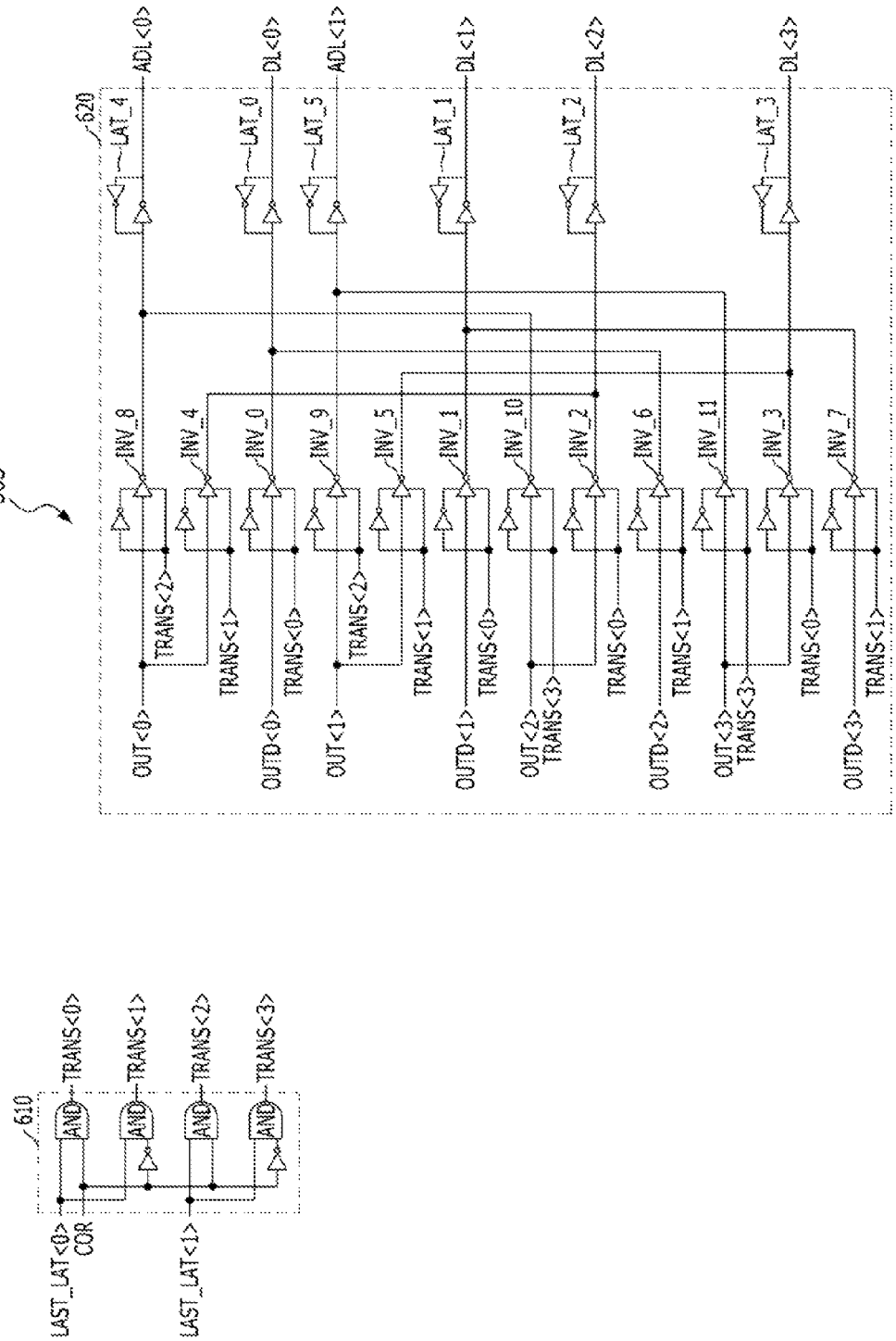
FIG. 6 is a diagram of a transfer unit shown in FIG. 3.

FIG. 6 is a diagram of the transfer unit 363 shown in FIG. 3.

As shown in FIG. 6, the transfer unit 363 may include a transfer signal generation section 610 and an internal transfer section 620.

The transfer signal generation section 610 may transfer a first last latch signal LAST_LAT<0> as a first transfer signal TRANS<0> and transfer a second last latch signal LAST_LAT<1> as a third transfer signal TRANS<2>, when the correspondence signal COR has the first logic value. Additionally, the transfer signal generation section 510 may transfer the first last latch signal LAST_LAT<0> as a second transfer signal TRANS<1> and transfer the second last latch signal LAST_LAT<1> as a fourth transfer signal TRANS<3>, when the correspondence signal COR has the second logic value.

The first last latch signal LAST_LAT<0> may be a signal which is activated at a time when finally latched data among the data latched by the data latch block 350 is latched. For example, when finally latched data among the data latched by the data latch block 350 is latched by the fourth latch signal DQS<3>, the first last latch signal LAST_LAT<0> may be a signal which is activated when the data is latched by the fourth latch signal DQS<3>, and, when finally latched data is latched by the second latch signal DQS<1>, the first last latch signal LASTLAT<0> may be a signal which is activated when the data is latched by the second latch signal DQS<1>.

Moreover, the second last latch signal LAST_LAT<1> may be a signal which is activated at a time when finally latched additional data among the additional data latched by the data latch block 350 is latched, such as when transferring the additional data. For example, when finally latched additional data among the additional data latched by the data latch block 350 is latched by the second latch signal DQS<1>, the second last latch signal LAST_LAT<1> may be a signal which is activated when the additional data is latched by the second latch signal DQS<1> and, when finally latched additional data is latched by the fourth latch signal DQS<3>, the second last latch signal LAST_LAT<1> may be a signal which is activated when the data is latched by the fourth latch signal DQS<3>.

The internal transfer section 620 may transfer the data OUTD<0>, OUTD<1>, OUTD<2> and OUTD<3> of the first to fourth output terminals OUT<0> to OUT<3> to the first to fourth data transfer lines DL<0:3>, respectively, when the first transfer signal TRANS<0> is activated, and may transfer the data OUTD<0>, OUTD<1>, OUTD<2> and OUTD<3> of the first to fourth output terminals OUT 0> to OUT<3> to the third and fourth data transfer lines DL<2:3> and the first and second data transfer lines DL<0:1>, respectively, when the second transfer signal TRANS<1> is activated. Moreover, the internal transfer section 620 may transfer the data OUTD<0:1> of the first and second output terminals OUT<0> and OUT<1> to the first and second additional data transfer lines ADL<0:1> respectively, when the third transfer signal TRANS<2> is activated, and may transfer the data OUTD<2:3> of the third and fourth output terminals OUT<2> and OUT<3> to the first and second additional data transfer lines ADL<0:1>, respectively, when the fourth transfer signal TRANS<3> is activated.

The internal transfer section 620 may include a plurality of inverters INV_0 to INV_11 and a plurality of latches LAT_0 to LAT_5. A plurality of first inverters INV_0 to INV_3 may invert and output inputted data when the first transfer signal TRANS<0> is activated, a plurality of second inverters INV_4 to INV_7 may invert and output inputted data when the second transfer signal TRANS<1> is activated, a plurality of third inverters INV_8 and INV_9 may invert and output inputted data when the third transfer signal TRANS<2> is activated, and a plurality of fourth inverters INV_10 and INV_11 may invert and output inputted data when the fourth transfer signal TRANS<3> is activated. The latches LAT_0 to LAT_5 may respectively correspond to the data transfer lines DL<0:3> and ADL<0:1>, and may invert the data outputted from activated inverters and output the inverted data to corresponding data transfer lines.

Figure 7A:
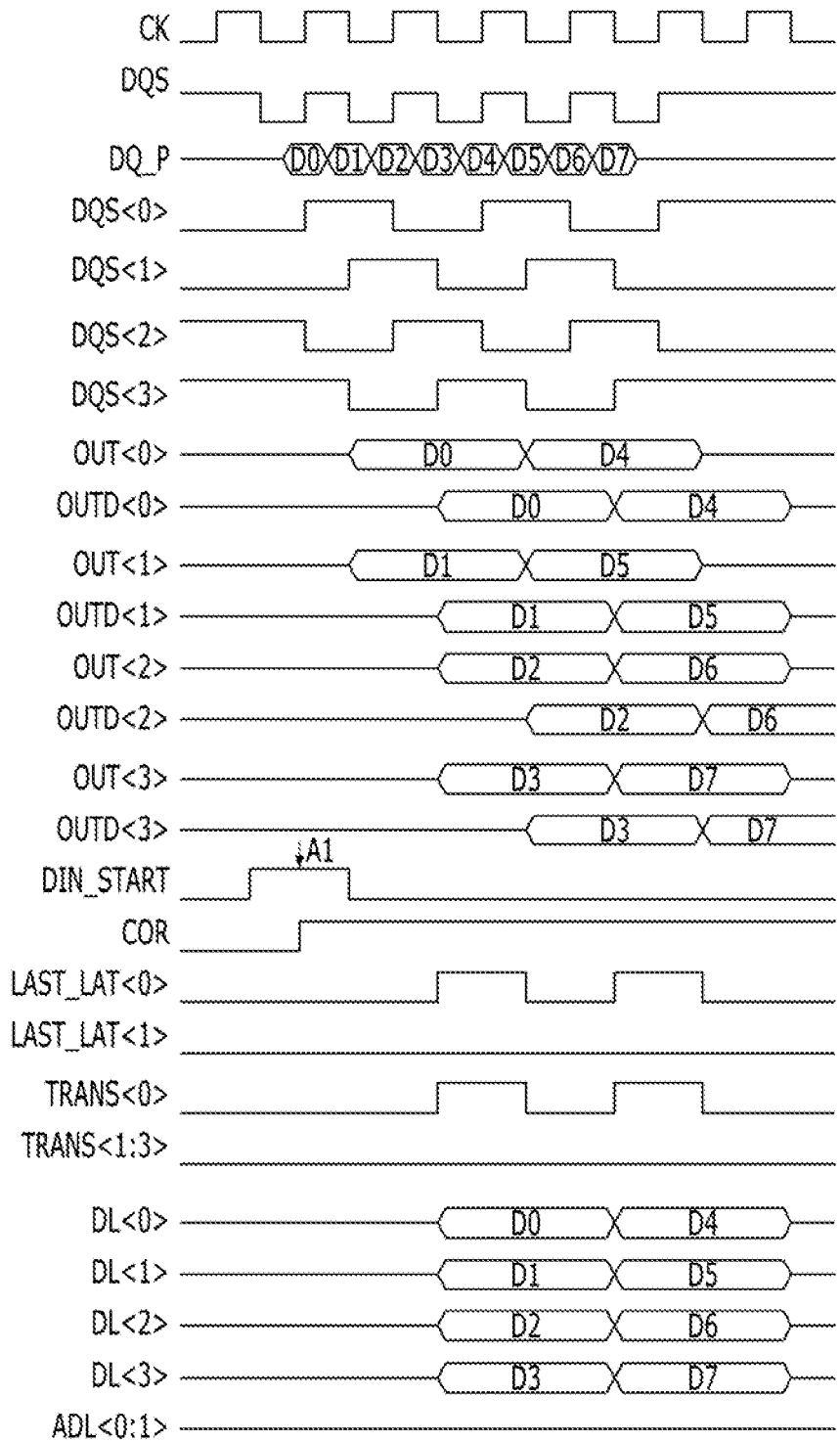
FIGS. 7A to 7D are waveform diagrams for describing operations of the semiconductor device shown in FIG. 3.

FIGS. 7A to 7D are waveform diagrams for describing operations of the semiconductor device shown in FIG. 3. FIG. 7A is a waveform diagram describing operations of the semiconductor device when the semiconductor device receives 8 data and does not receive additional data.

Figure 8:
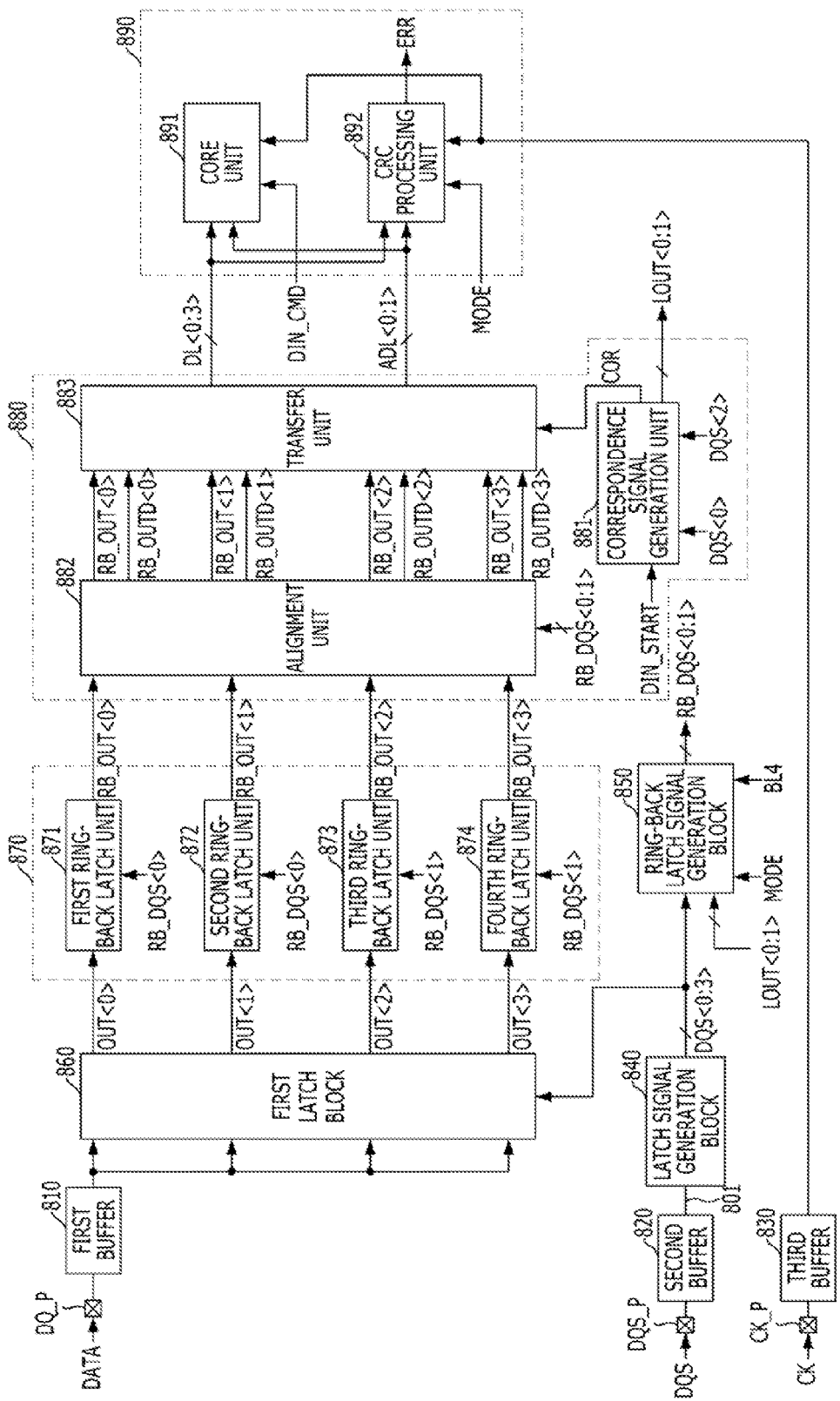
FIG. 8 is a block diagram illustrating a semiconductor device in accordance with an embodiment of the present invention.

In FIG. 7A, 8 data D0 to D7 are inputted in series through the data pad DQ_P in correspondence to the data input command DIN_CMD. First and fifth data D0 and D4 are latched by the first latch signal DQS<0>.

The 8 data D0 to D7, which are inputted through the data pad DQ_P, are inputted to the semiconductor device along with the data strobe signal DQS that is inputted through the data strobe pad DQS_P. The semiconductor device generates the first to fourth latch signals DQS<0:3> by using the data strobe signal DQS.

The data latch block 350 latches first and second data D0 and D1 and fifth and sixth data D4 and D5 in response to the first and second latch signals DQS<0:1>, and outputs the latched data to the first and second output terminals OUT<0:1> in alignment with the second latch signal DQS<1>. Furthermore, the data latch block 350 latches third and fourth data D2 and D3 and seventh and eighth data D6 and D7 in response to the third and fourth latch signals DQS<2:3>, and outputs the latched data to the third and fourth output terminals OUT<2:3> in alignment with the fourth latch signal DQS<3>.

The alignment unit 362 aligns the data of the first and second output terminals OUT<0:1> based on the fourth latch signal DQS<3> and generates the data OUTD<0> and OUTD<1>, and aligns the data of the third and fourth output terminals OUT<2:3> based on the second latch signal DQS<1> and generates the data OUTD<2> and OUTD<3>.

Since the input start signal DIN_START is latched by the first latch signal DQS<0> as indicated by the arrow A1, the correspondence signal COR has the first value, for example, a high logic level, and the first last latch signal LAST_LAT<0> is transferred as the first transfer signal TRANS<0>. Accordingly, the data OUTD<0>, OUTD<1>, OUTD<2> and OUTD<3> are respectively transferred to the first to fourth data transfer lines DL<0:3>.

Figure 7B:
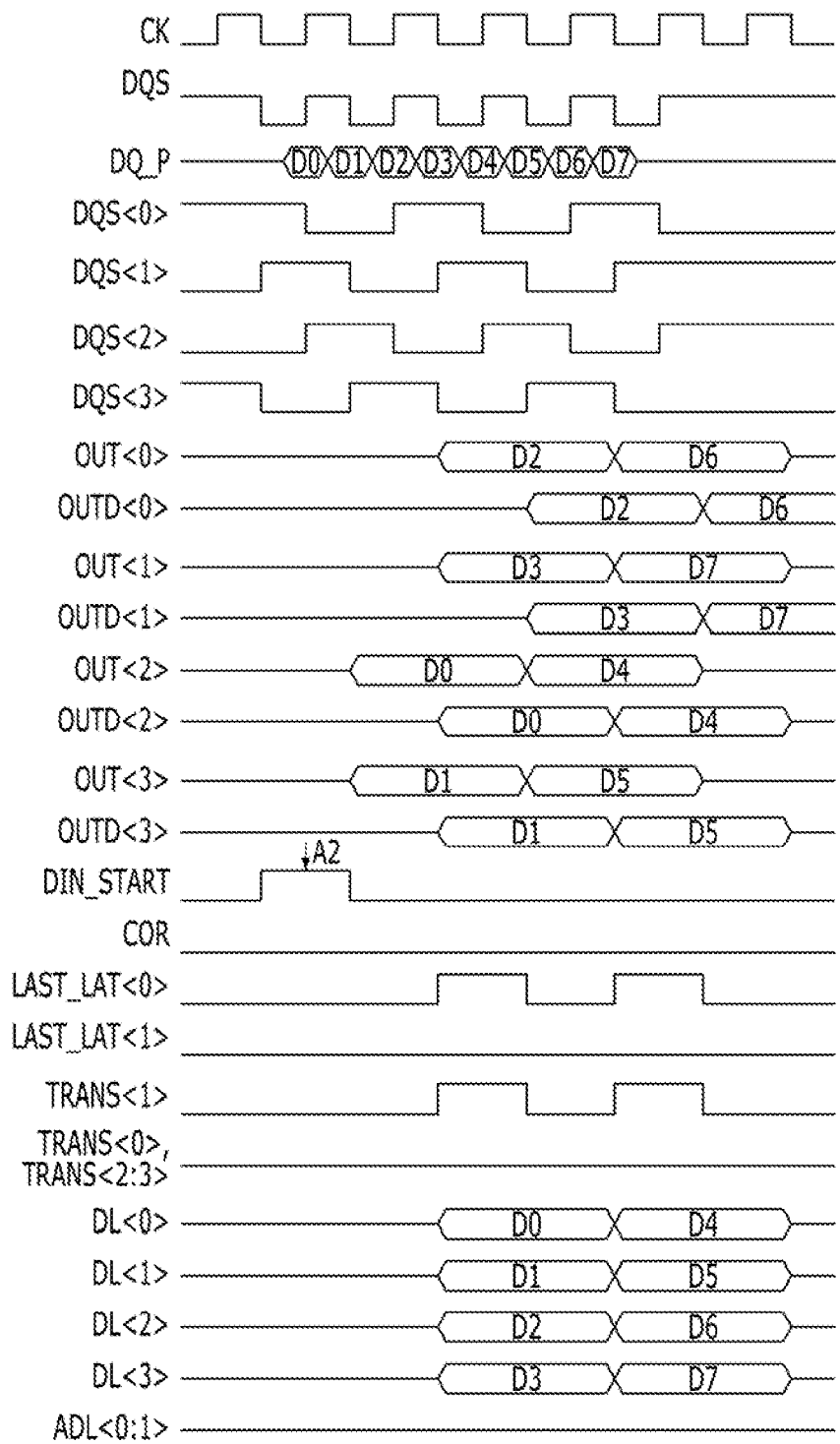

FIG. 7B is a waveform diagram describing operations of the semiconductor device when the semiconductor device receives 8 data and does not receive additional data.

In FIG. 7B, 8 data D0 to D7 are inputted in series through the data pad DQ_P in correspondence to the data input command DIN_CMD. First and fifth data D0 and D4 are latched by the third latch signal DQS<2>.

The data latch block 350 latches third and fourth data D2 and D3 and seventh and eighth data D6 and D7 in response to the first and second latch signals DQS<0:1>, and outputs the latched data to the first and second output terminals OUT<0:1> in alignment with the second latch signal DQS<1>. Additionally, the data latch block 350 latches first and second data D0 and D1 and fifth and sixth data D4 and D5 in response to the third and fourth latch signals DQS<2:3>, and outputs the latched data to the third and fourth output terminals OUT<2:3> in alignment with the fourth latch signal DQS<3>.

Since the input start signal DIN_START is latched by the third latch signal DQS<2> as indicated by the arrow A2, the correspondence signal COR has the second value, for example, a low logic level, and the first last latch signal LAST_LAT<0> is transferred as the second transfer signal TRANS<1>. Accordingly, the data OUTD<2>, OUTD<3>, OUTD<0> and OUTD<1> are respectively transferred to the first to fourth data transfer lines DL<0:3>.

Figure 7C:
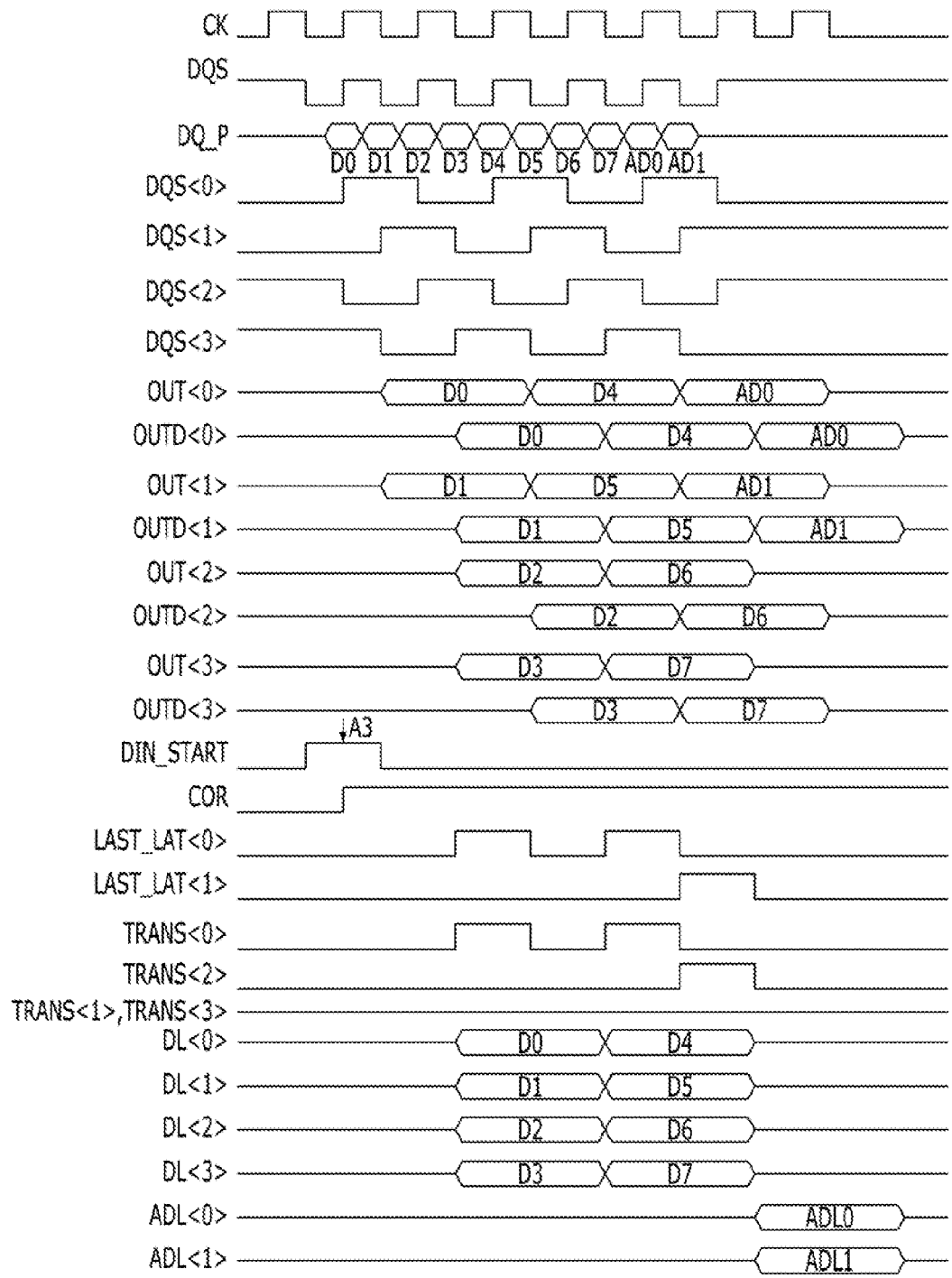

FIG. 7C is a waveform diagram describing operations of the semiconductor device when the semiconductor device receives 8 data and 2 additional data.

In FIG. 7C, 10 data D0 to D7, AD0 and AD1 are inputted in series through the data pad DQ_P in correspondence to the data input command DIN_CMD. First and fifth data D0 and D4 and first additional data AD0 are latched by the first latch signal DQS<0>.

The data latch block 350 latches first and second data D0 and D1, fifth and sixth data D4 and D5 and first and second additional data AD0 and AD1 in response to the first and second latch signals DQS<0:1>, and outputs the latched data to the first and second output terminals OUT<0:1> in alignment with the second latch signal DQS<1>, Moreover, the data latch block 350 latches third and fourth data D2 and 03 and seventh and eighth data D6 and D7 in response to the third and fourth latch signals DQS<2:3>, and outputs the latched data to the third and fourth output terminals OUT<2:3> in alignment with the fourth latch signal DQS<3>.

Since the input start signal DIN_START is latched by the first latch signal DQS<0 as indicated by the arrow A3, the correspondence signal COR has the first value, for example, a high logic level. The first last latch signal LAST_LAT<0> is transferred as the first transfer signal TRANS<0> when the 8 data D0 to D7 are inputted, and the second last latch signal LAST_LAT<1> is transferred as the third transfer signal TRANS<2> when the additional data AD0 and AD1 are inputted. Accordingly, in the former case, the data OUTD<0>, OUTD<1>, OUTD<2> and OUTD<3> are respectively transferred to the first to fourth data transfer lines DL<0:3>, and in the latter case, the data OUTD<0> and OUTD<1> are respectively transferred to the first and second additional data transfer lines ADL<0:1>.

Figure 7D:
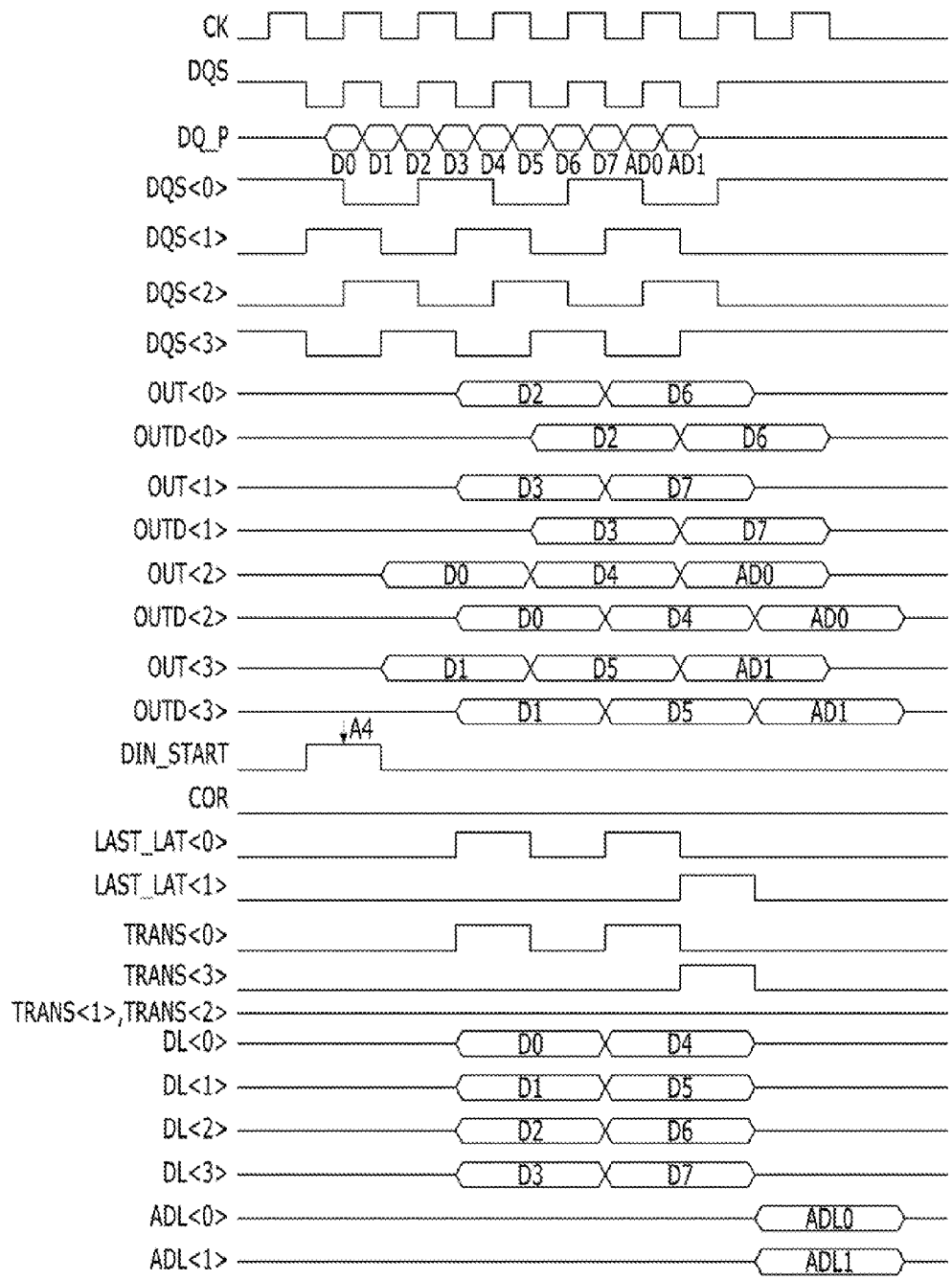

FIG. 7D is a waveform diagram describing operations of the semiconductor device when the semiconductor device receives 8 data and 2 additional data.

In FIG. 7D, 10 data D0 to D7, AD0 and AD1 are inputted in series through the data pad DQ_P in correspondence to the data input command DIN_CMD. First and fifth data D0 and D4 and first additional data AD0 are latched by the third latch signal DQS<2>.

The data latch block 350 latches third and fourth data D2 and D3 and seventh and eighth data D6 and D7 in response to the first and second latch signals DQS<0:1>, and outputs the latched data to the first and second output terminals OUT<0:1> in alignment with the second latch signal DQS<1>, The data latch block 350 latches first and second data D0 and D1, fifth and sixth data D4 and D5, and first and second additional data AD0 and AD1 in response to the third and fourth latch signals DQS<2:3>, and outputs the latched data to the third and fourth output terminals GUT<2:3> in alignment with the fourth latch signal DQS<3>.

Since the input start signal DIN_START is latched by the third latch signal DQS<2> as indicated by the arrow A4, the correspondence signal COR has the second value for example, a low logic level. The first last latch signal LAST-LAT<0> is transferred as the second transfer signal TRANS<1> when the 8 data D0 to D7 are inputted, and the second last latch signal LAST_LAT<i> is transferred as the fourth transfer signal TRANS<3> when the additional data AD0 and AD1 are inputted. Accordingly, in the former case, the data OUTD<2>, OUTD<3>, OUTD<0> and OUTD<1> are respectively transferred to the first to fourth data transfer lines DL<0:3>, and in the latter case, the data OUTD<2> and OUTD<3> are respectively transferred to the first and second additional data transfer lines ADL<0:1>.

FIG. 8 is a block diagram illustrating a semiconductor device in accordance with an embodiment of the present invention.

As shown in FIG. 8, the semiconductor device may include a first buffer 810, a second buffer 820, a third buffer 830, a latch signal generation block 840, a ringback latch signal generation block 850, a first data latch block 860, a second data latch block 870, a data transfer block 880, a plurality of data transfer lines DL<0:3> and ADL<0:1>, and an internal circuit 890.

For transmission of data, a data strobe signal DQS toggles for a predetermined period and retains a high impedance (Hi-Z') state in the other period. When a glitch occurs in the data strobe signal DQS due to noise, as the data strobe signal DQS does not return to the high impedance state immediately after toggling ends, erroneous toggling may occur and invalid data may be inputted, FIG. 8 shows a semiconductor device in which a configuration for ringback control is added to the semiconductor device of FIG. 3, to prevent the occurrence of a ringing phenomenon as described above.

Hereinbelow, descriptions are made for when the semiconductor device aligns in parallel the data inputted in series through a data pad DCLP, by the unit of 4, and transfers the aligned data to 4 data transfer lines DL<0:3>, and, if 2 additional data are inputted through the data pad DQ, $J^3$, the semiconductor device aligns in parallel the additional data and transfers the aligned additional data to 2 additional data transfer lines ADL<0:1>. The numbers of the data inputted in series, the data transfer lines and the additional data transfer lines may be changed according to a design.

Descriptions for the first to third buffers 810 to 830, the latch signal generation block 840, the internal circuit 890, and the data transfer lines DL<0:3> and ADL<0:1> are the same as the descriptions for the first to third buffers 310 to 330, the latch signal generation block 340, the internal circuit 370, and the data transfer lines DL__<0:3> and ADL<0:1> shown in FIG. 3.

As in the semiconductor device shown in FIG. 3, the data strobe signal DQS may be transferred to the latch signal generation block 840 through a strobe line 801. One end of the strobe line 801 may be directly connected to the second buffer 820, and the other end of the strobe line 801 may be directly connected to the latch signal generation block 840. The strobe line 801 may be a conductive line which does not include any delay element for a signal, except parasitic components such as parasitic resistance and parasitic capacitance.

The ringback latch signal generation block 850 may generate one or more ringback latch signals RB_DQS<0:1> each activated for a period corresponding to a time during which data corresponding to a data input command DIN_CMD is inputted, in response to at least one latch signal of a plurality of latch signals DQS<0:3>. The ringback latch signal generation block 850 may transfer second and fourth latch signals DQS<1> and DQS<3> as first and second ringback latch signals RB_DQS<0:1 respectively, according to the burst length of the data inputted in correspondence to the data input command DIN_CMD. The ringback latch signal generation block 850 may control a period during which the second and fourth latch signals DQS<1> and DQS<3> are transferred as the first and second ringback latch signals RB_DQS<0:1 respectively, according to a mode signal MODE.

That is, the ringback latch signal generation block 850 may perform the function of limiting the toggling period of the latch signals such that the latch signals may toggle for only a period needed for the data inputted through the data pad DQ_P to be latched and transferred. The first data latch block 860 may latch the data inputted in series through the first buffer 810, in response to the latch signals DQS<0:3>. The first data latch block 860 corresponds to the data latch block 350 of the semiconductor device shown in FIG. 3, and may be the same in configuration and operations as the data latch block 350 described above with reference to FIG. 3.

The second data latch block 870 may latch the data outputted through output terminals OUT<0:3> from the first data latch block 860, in response to the one or more ringback latch signals R13_DQS<0:1>. The second data latch block 870 may include a plurality of ringback output terminals RB_OUT<0:3> respectively corresponding to the output terminals OUT<0:3>, and may output the data latched by the one or more ringback latch signals RB_DC2S<0:1>, to the ringback output terminals RBLOUT<0:3> corresponding to the output terminals OUT<0:3>.

For these operations, the second data latch block 870 may include first to fourth ringback latch units 871 to 874. The first ringback latch unit 871 may latch the data of the first output terminal OUT<0> in response to the first ringback latch signal RB_DQS<0>, and may output the latched data to a first ringback output terminal RB_OUT<0>, The second ringback latch unit 872 may latch the data of the second output terminal OUT<1, in response to the first ringback latch signal RB DQ<0>, and may output the latched data to a second ringback output terminal RB_OUT<1>. The third ringback latch unit 873 may latch the data of the third output terminal OUT<2> in response to the second ringback latch signal RELDQS<1>, and may output the latched data to a third ringback output terminal RB_OUT<2>. The fourth ringback latch unit 874 may latch the data of the fourth output terminal OUT<3> in response to the second ringback latch signal RB_DQS<1>, and may output the latched data to a fourth ringback output terminal RB_OUT<3>.

The data transfer block 880 may transfer the data latched by the second data latch block 870, to the data transfer lines DL<0:3> and ADL<0:1>, according to a correspondence relationship that is determined in response to an input start signal DIN_START, which is activated at the time when the input of the data corresponding to the data input command DIN_CMD is started.

The data transfer block 880 may transfer the data of the first to fourth ringback output terminals RB_OUT<0:3> to first to fourth data transfer lines DL<0:3>, at the same correspondence relationship as described above with reference to FIG. 3, according to which latch signal the input start signal DIN_START is latched. For additional data, the data of the first and second ringback output terminals RB_OUT<0:1> or the data of the third and fourth ringback output terminals RB_OUT<2:3> may be transferred to first and second additional data transfer lines ADL<0:1>.

The data transfer block 880 may align in parallel the data outputted from the second data latch block 870, based on a time when finally latched data among the data latched by the second data latch block 870 is latched. For example, when the data latched by the first latch signal DQS<0> among the data latched by the second data latch block 870 is first latched data, the data transfer block 880 may align and output the data latched by the second data latch block 870, based on a time when the second ringback latch signal RB_DQS<1> is activated. Further, when the data latched by the third latch signal DQS<2> among the data latched by the second data latch block 870 is first latched data, the data transfer block 880 may align and output the data latched by the second data latch block 870, based on a time when the first ringback latch signal RBDQS<0> is activated. Thus, the data transferred to the first to fourth data transfer lines DL<0:3> may be aligned according to turns at which they are inputted, and may have the same phase.

To perform the above-described operations, the data transfer block 880 may include a correspondence signal generation unit 881, an alignment unit 882, and a transfer unit 883. The configuration and operations of the correspondence signal generation unit 881 may be the same as the configuration and operations of the correspondence signal generation unit 361 shown in FIGS. 3 and 5.

The alignment unit 882 may align and output the data of the first to fourth ringback output terminals RB_OUT<0.3> in synchronization with the first ringback latch signal RB_DQS<0> and the second ringback latch signal RB_DQS<1>. The alignment unit 882 may align the data of the first and second ringback output terminals RB_OUT<0> and RB_OUT<1> in response to the second ringback latch signal DQS<1> and output data RB_OUTD<0> and RB_OUTD<1>. Furthermore, the alignment unit 882 may align the data of the third and fourth ringback output terminals RB_OUT<2> and RB_OUT<3> in response to the first ringback latch signal RB_DQS<0> and output data RB_OUTD<2> and RB_OUTD<3>. Therefore, the data RB_OUTD<0> and RB_OUTD<1> may be data which are latched by the first ringback latch signal RB_DQS<0> and are aligned by the second ringback latch signal RB_DC2S<1>. The data RB_OUTD<2> and RB_OUTD<3> may be data which are latched by the second ringback latch signal RB_DQS<1> and are aligned by the first ringback latch signal RB_DQS<0>.

The transfer unit 883 may transfer the data of the first to fourth ringback output terminals RELOUT<0> to RB_OUT<3> to the first to fourth data transfer lines DL<0> to DL<3>, respectively, when a correspondence signal COR has a first logic value, and may transfer the data of the first to fourth ringback output terminals RB_OUT<0> to RBOUT<3> to the third and fourth data transfer lines DL<2> and DL<3> and the first and second data transfer lines DL<0> and DL<1>, respectively, when the correspondence signal COR has a second logic value.

Further, when transferring the additional data inputted through the first buffer 810, the transfer unit 883 may transfer the data of the first and second ringback output terminals RB_OUT<0> and RBOUT<1> to the first and second additional data transfer lines ADL 0> and ADL<1> when the correspondence signal COR has the first logic value, and may transfer the data of the third and fourth ringback output terminals R8_OUT<2> and RB_OLIT<3> to the first and second additional data transfer lines ADL<0> and ADL<1> when the correspondence signal COR has the second logic value.

The detailed configuration and operations of the transfer unit 883 are the same as the detailed configuration and operations of the transfer unit 363 described above with reference to FIGS. 3 and 6.

The semiconductor device shown in FIG. 8 may prevent invalid data from being transferred due to a ringing phenomenon of the data strobe signal DQS, thereby improving the reliability of the semiconductor device, while decreasing a jitter and increasing a setup/hold margin as in the semiconductor device shown in FIG. 3.

Figure 9:
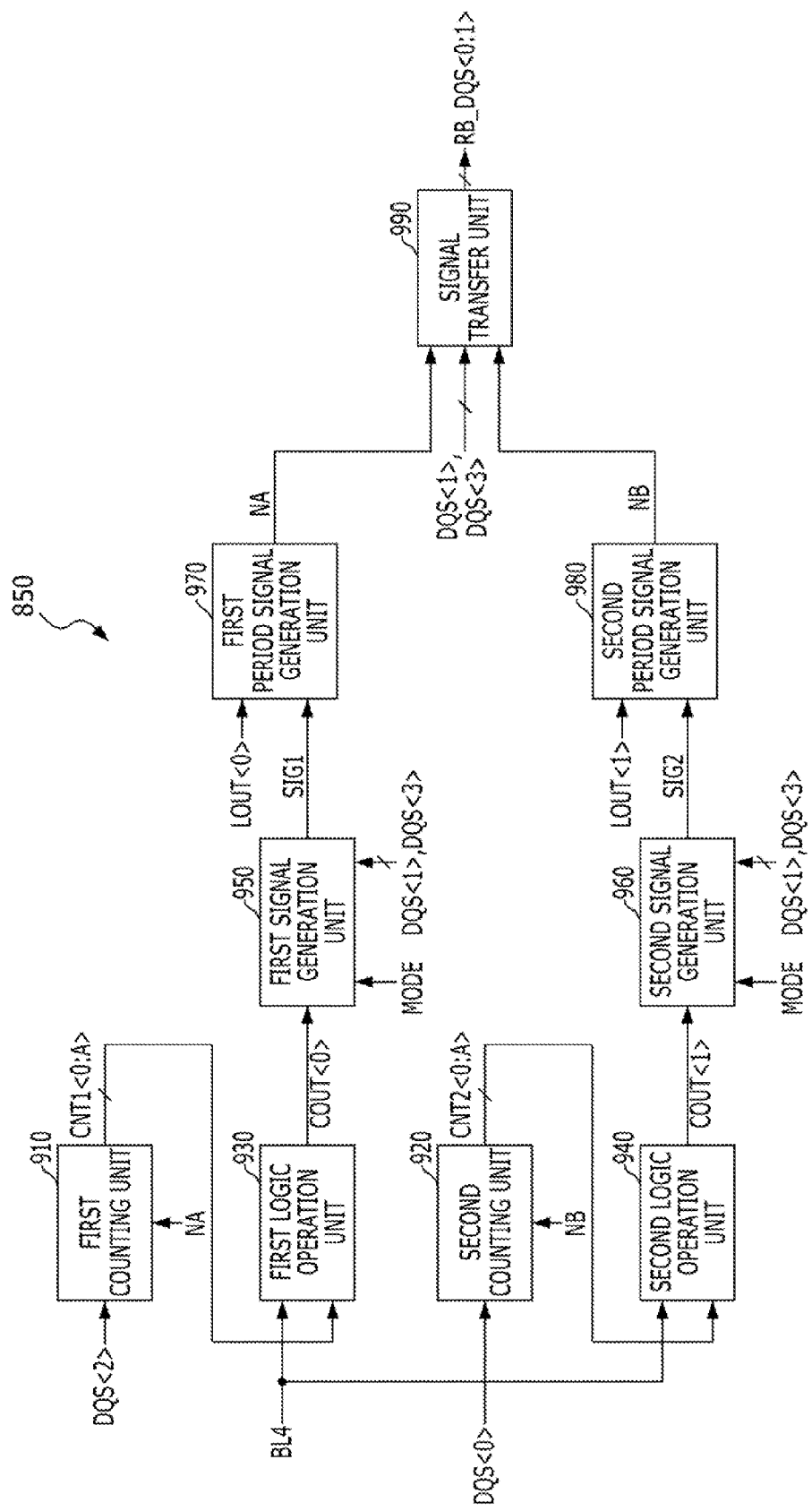
FIG. 9 is a detailed diagram of a ringback back signal generation block shown in FIG. 8.

FIG. 9 is a detailed diagram of the ring-back latch signal generation block 850 shown in FIG. 8.

As shown in FIG. 9, the ringback latch signal generation block 850 may include a first counting unit 910, a second counting unit 920, a first logic operation unit 930, a second logic operation unit 940, a first signal generation unit 950, a second signal generation unit 960, a first period signal generation unit 970, a second period signal generation unit 980, and a signal transfer unit 990.

The first period signal generation unit 970 may activate a first period signal NA when an output LOUT<0> shown in FIG. 5 is activated (that is, when the correspondence signal COR becomes the first logic va ue, and may deactivate the first period signal NA when an output SIG1 of the first signal' generation unit 950 is activated. Further, the second period signal generation unit 980 may activate a second period signal NB when an output LOUT<1> is activated (that is, when the correspondence signal COR becomes the second logic value), and may deactivate the second period signal NB when an output SIG2 of the second signal generation unit 960 is activated.

The signal transfer unit 990 may transfer the second and fourth latch signals DQS<1> and DQS<3> as the first and second ringback latch signals RB_DQS<0:1> during a period having at least one period signal of the first period signal NA and the second period signal NB activated.

The first counting unit 910 may count the number of times the third latch signal DQS<2> is activated during the period in which the first period signal NA is activated, and may generate first counting values CNT1<0:A> corresponding to a result thereof. The second counting unit 920 may count the number of times the first latch signal DQS<0> is activated during the period in which the second period signal NB is activated, and may generate second counting values CNT2<0:A> corresponding to a result thereof.

The first logic operation unit 930 may combine a burst length signal BL4 and the first counting values CNT1<0:A>, and output a result as an output COUT<0>. The burst length signal as a signal indicating the number of the data inputted in correspondence to the data input command DIN_CMD, may be a signal which is activated when the number of the data inputted in correspondence to the data input command DIN_CMD is 4 and is deactivated when the number is 8. The first logic operation unit 930 may activate the output. COUT<0> when the first counting values CNT1<0:A> correspond to a result that the activation of the third latch signal DQS<2> is counted 1 time, when the burst length signal BL4 is activated. Moreover, the first logic operation unit 930 may activate the output COUT 0> when the first counting values CNT1<0:A> correspond to a result that the activation of the third latch signal DQS<2> is counted 2 times, when the burst length signal BL4 is deactivated.

The second logic operation unit 940 may combine the burst length signal BL4 and the second counting values CNT2<0:A>, and output a result as an output COUT<1>. Similar to the first logic operation unit 930, the second logic operation unit 940 may activate the output COUT<1> when the second counting values CNT2<0:A> correspond to a result that the activation of the first latch signal DQS<0> is counted 1 time, when the burst length signal BL4 is activated. Moreover, the second logic operation unit 940 may activate the output COUT<1> when the second counting values CNT2<0:A> correspond to a result that the activation of the first latch signal DQS<0> is counted 2 times, when the burst length signal 6L4 is deactivated.

The first signal generation unit 950 may transfer the output COUT 0> of the first logic operation unit 930 as the output SIG1 when the fourth latch signal DQS<3> is activated when the mode signal MODE is deactivated, and may transfer the output COUT<0> of the first logic operation unit 930 as the output SIG1 when the second latch signal DQS<1> is activated when the mode signal MODE is activated.

The second signal generation unit 960 may transfer the output COUT<1> of the second logic operation unit 940 as the output SIG2 when the second latch signal DQS<1> is activated when the mode signal MODE is deactivated, and may transfer the output COUT 1> of the second logic operation unit 940 as the output SIG2 when the fourth latch signal DQS<3> is activated when the mode signal MODE is activated.

If the input start signal DIN_START is latched by the first latch signal DQS<0> the first period signal NA is activated, and the second and fourth latch signals DQS<1> and DQS<3> are respectively transferred as the first and second ringback latch signals RB_DQS<0:1>. The first counting unit 910 counts the number of times the third latch signal DQS<2> is activated, after the first period signal NA is activated. If additional data are not inputted and when a burst length is 4, the first period signal NA is deactivated when the fourth latch signal DQS<3> is activated after the number of activation times of the third latch signal DQS<2> is counted 1 time. If additional data are inputted when a burst length is 4, the first period signal NA is deactivated when the second latch signal DQS<1> is activated after the number of activation times of the third latch signal DQS<2> is counted 1 time. If the first period signal NA is deactivated, the second and fourth latch signals DQS<1> and DQS<3> are blocked, and the first and second ringback latch signals RB_DQS<0:1> are deactivated. If additional data are not inputted when a burst length is 8, the first period signal NA is deactivated when the fourth latch signal NQS<3> is activated after the number of activation times of the third latch signal DQS<2> is counted 2 times. If additional data are inputted when a burst length is 8, the first period signal NA is deactivated when the second latch signal DQS<1> is activated after the number of activation times of the third latch signal DQS<2> is counted 2 times.

If the input start signal DIN_START is latched by the third latch signal DQS<2>, the second period signal NB is activated, and the second and fourth latch signals DQS<1> and DQS<3> are respectively transferred as the first and second ringback latch signals RB_DQS<0:1>, The second counting unit 920 counts the number of times the first latch signal DQS<0> is activated, after the second period signal NB is activated. If additional data are not inputted when a burst length is 4, the second period signal NB is deactivated when the second latch signal DQS<1> is activated after the number of activation times of the first latch signal DQS<0> is counted 1 time. If additional data are inputted when a burst length is 4, the second period signal NB is deactivated when the fourth latch signal DQS<3> is activated after the number of activation times of the first latch signal DQS<0> is counted 1 time. If the second period signal NB is deactivated, the second and fourth latch signals DQS<1> and DQS<3> are blocked, and the first and second ringback latch signals RB_DQS<0:1> are deactivated. If additional data are not inputted when a burst length is 8, the second period signal NB is deactivated when the second latch signal DQS<1> is activated after the number of activation times of the first latch signal DQS<0> is counted 2 times. If additional data are inputted when a burst length is 8, the second period signal NB is deactivated when the fourth latch signal DQS<3> is activated after the number of activation times of the first latch signal DQS<0> is counted 2 times.

FIGS. 10A to 10D are waveform diagrams for describing operations of the semiconductor device shown in FIG. 8.

Figure 10A:
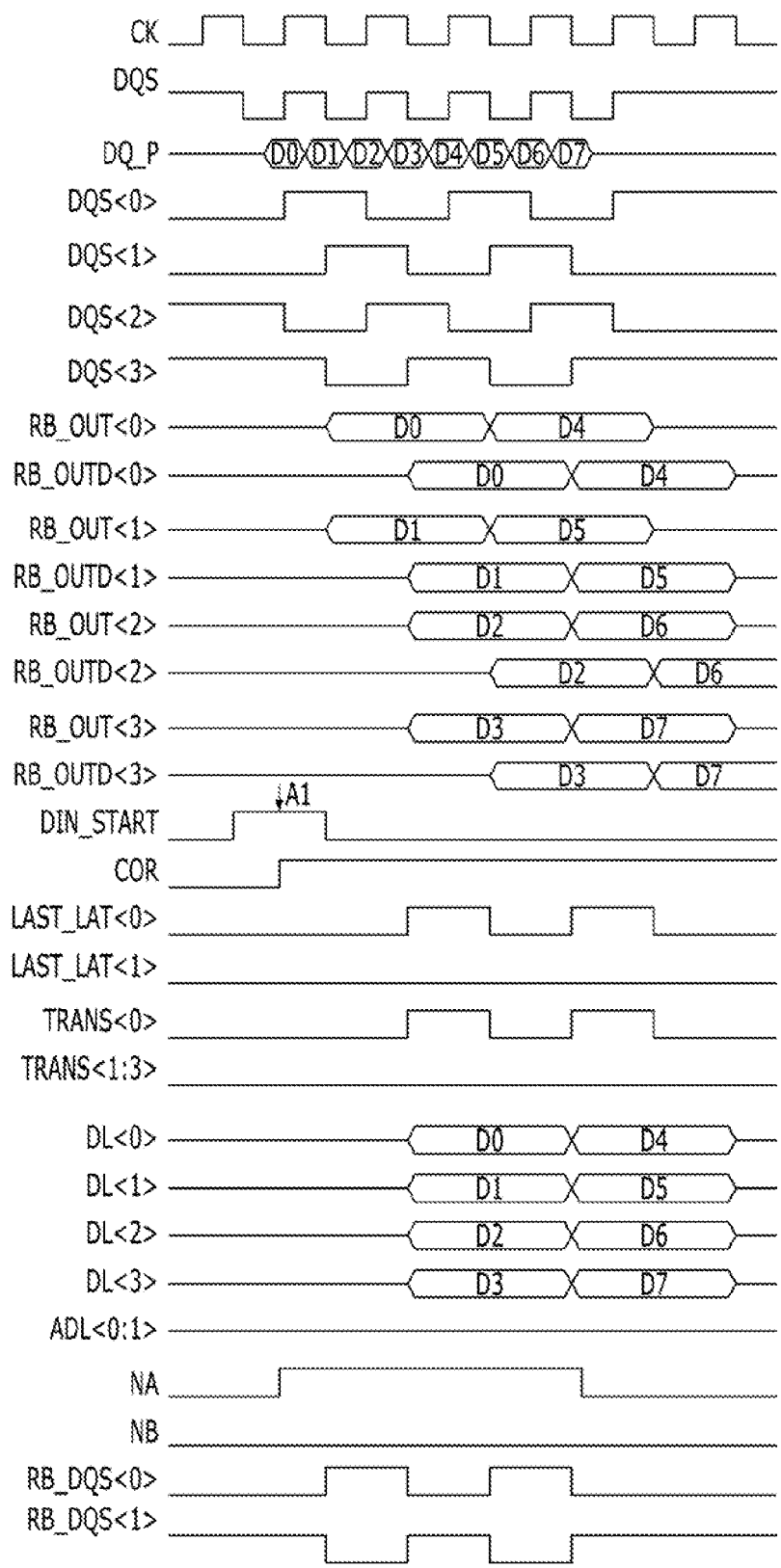

FIG. 10A is a waveform diagram describing operations of the semiconductor device when the semiconductor device receives 8 data and does not receive additional data.

In FIG. 10A, 8 data D0 to D7 are inputted in series through the data pad DQ_P in correspondence to the data input command DIN_CMD. First and fifth data D0 and D4 are latched by the first latch signal DQS<0>.

The 8 data D0 to D7, which are inputted through the data pad DQ_P, are inputted to the semiconductor device along with the data strobe signal DQS that is inputted through the data strobe pad DQS_P. The semiconductor device generates the first to fourth latch signals DQS<0:3> by using the data strobe signal DQS.

The ringback latch signal generation block 850 activates the first period signal NA from a time when the input start signal DIN_START is latched by the first latch signal DQS<0> to until the fourth latch signal DQS<3> is activated after the third latch signal DQS<2> is activated 2 times, and transfers the second and fourth latch signals DQS<1> and DQS<3> as the first and second ringback latch signals RB_DQS<0:1> during the period in which the first period signal NA is activated.

The first data latch block 860 latches first and second data D0 and D1 and fifth and sixth data D4 and D5 in response to the first and second latch signals DQS<0:1> and outputs the latched data to the first and second output terminals OUT<0: 1> in alignment with the second latch signal DQS<1>. Additionally, the first data latch block 860 latches third and fourth data D2 and D3, and seventh and eighth data D6 and D7 in response to the third and fourth latch signals DQS<2:3>, and outputs the latched data to the third and fourth output terminals OUT<2:3> in alignment with the fourth latch signal DQS<3>.

The second data latch block 870 latches the data of the first and second output terminals OUT<0:1> in response to the first ringback latch signal RB_DQS<0>, and outputs the data to the first and second ringback output terminals RB_OUT<0: 1>. The second data latch block 870 latches the data of the third and fourth output terminals OUT<2:3> in response to the second ringback latch signal RB_DQS<1>, and outputs the data to the third and fourth ringback output terminals RB_OUT<2:3>.

The alignment unit 882 aligns the data of the first and second ringback output terminals RB_OUT<0:1> based on the second ringback latch signal RB_DQS<1> and generates the data RB_OUTD<0> and RB_OUTD<1>, and aligns the data of the third and fourth ringback output terminals RB_OUT 2:3> based on the first ringback latch signal RB_DQS<0> and generates the data RB_OUTD<2> and RB_OUTD<3>.

Since the input start signal DIN_START is latched by the first latch signal DQS<0> as indicated by the arrow A1, the correspondence signal COR has the first value, for example, a high logic level, and a first last latch signal LAST_LAT<0> is transferred as a first transfer signal TRANS<0>. Accordingly, the data RB_OUTD<0>, RB_OUTD<1>, RB_OUTD<2> and RB_OUTD<3> are respectively transferred to the first to fourth data transfer lines DL<0:3>.

Figure 10B:
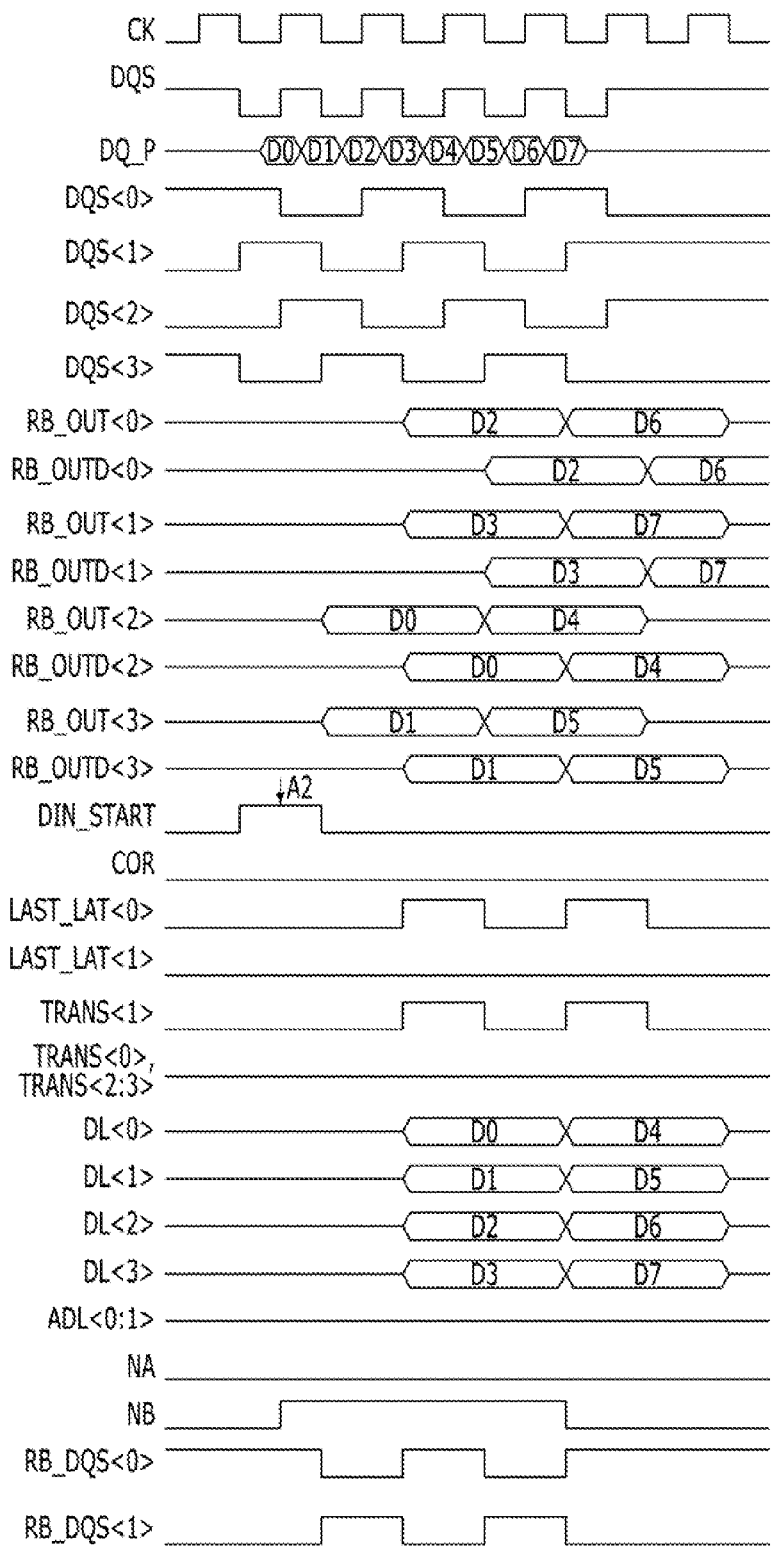

FIG. 10B is a waveform diagram describing operations of the semiconductor device when the semiconductor device receives 8 data and does not receive additional data.

In FIG. 10B, 8 data D0 to D7 are inputted in series through the data pad DQ_P in correspondence to the data input command DIN_CMD. First and fifth data D0 and D4 are latched by the third latch signal DQS<2>.

The ringback latch signal generation block 850 activates the second period signal NB from a time when the input start signal DIN_START is latched by the third latch signal DQS<2> to until the second latch signal DQS<1> is activated after the first latch signal DQS<0> is activated 2 times, and transfers the second and fourth latch signals DQS<1> and DQS<3> as the first and second ringback latch signals RB_DQS<0:1> during the period in which the second period signal NB is activated.

The first data latch block 860 latches third and fourth data D2 and D3, and seventh and eighth data D6 and D7 in response to the first and second latch signals DQS<0:1>, and outputs the latched data to the first and second output terminals OUT<0:1> in alignment with the second latch signal DQS<1>. The first data latch block 860 latches first and second data D0 and D1 and fifth and sixth data D4 and D5 in response to the third and fourth latch signals DQS<2:3> and outputs the latched data to the third and fourth output terminals OUT<2:3> in alignment with the fourth latch signal DQS<3>.

Since the input start signal DIN_START is latched by the third latch signal DQS<2> as indicated by the arrow A2, the correspondence signal COR has the second value for example, a low logic level, and a first last latch signal LAST_LAT O> is transferred as a second transfer signal TRANS<1>. Accordingly, the data RB_OUTD<2>, RB_OUTD<3>, RB_OUTD<0> and RB_OUTD<1> are respectively transferred to the first to fourth data transfer lines DL<0:3>.

FIG. 10C is a waveform diagram describing operations of the semiconductor device when the semiconductor device receives 8 data and 2 additional data.

In FIG. 10C, 10 data D0 to D7, AD0 and AD1 are inputted in series through the data pad DQ_P in correspondence to the data input command DIN_CMD, First and fifth data D0 and D4 and first additional data AD0 are latched by the first latch signal DQS<0>.

The ringback latch signal generation block 850 activates the first period signal NA from a time when the input start signal DIN_START is latched by the first latch signal DQS<0> to until the second latch signal DQS<1> is activated after the third latch signal DQS<2> is activated 2 times, and transfers the second and fourth latch signals DQS<1> and DQS<3> as the first and second ringback latch signals RB_DQS<0:1> during the period in which the first period signal NA is activated.

The first data latch block 860 latches first and second data D0 and D1, fifth and sixth data D4 and D5 and first and second additional data AD0 and AD1 in response to the first and second latch signals DQS<0:1> and outputs the latched data to the first and second output terminals OUT<0:1 in alignment with the second latch signal DQS<1>. The data latch block 860 latches third and fourth data D2 and D3 and seventh and eighth data D6 and D7 in response to the third and fourth latch signals DQS<2:3>, and outputs the latched data to the third and fourth output terminals OUT<2:3> in alignment with the fourth latch signal DQS<3>.

Since the input start signal DIN_START is latched by the first latch signal DQS<0> as indicated by the arrow A3, the correspondence signal COR has the first value, for example, a high logic level. A first last latch signal LAST_LAT<0> is transferred as a first transfer signal TRANS<0> when the 8 data D0 to D7 are inputted, and a second last latch signal LAST_LAT<1> is transferred as a third transfer signal TRANS<2> when the additional data AD0 and AD1 are inputted. Accordingly, in the former case, the data RB_OUTD<0>, RB_OUTD<1 RB_OUTD<2 and RB_OUTD<3> are respectively transferred to the first to fourth data transfer lines DL<0:3> and in the latter case, the data RB_OUTD<0> and RB_OUTD 1> are respectively transferred to the first and second additional data transfer lines ADL<0:1>.

Figure 10D:
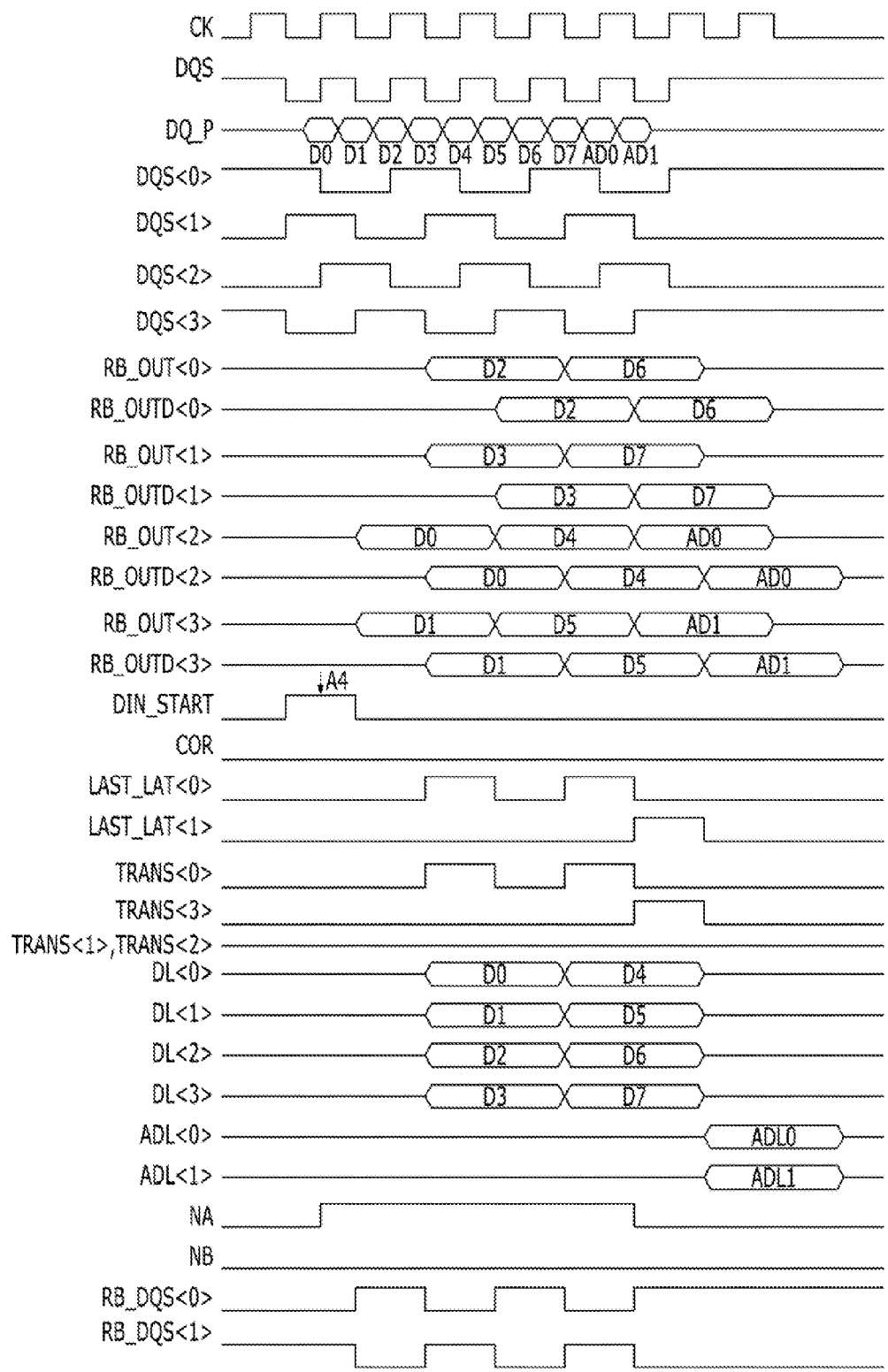

FIG. 10D is a waveform diagram describing operations of the semiconductor device when the semiconductor device receives 8 data and 2 additional data.

In FIG. 10D, 10 data D0 to D7, AD0 and AD1 are inputted in series through the data pad DQ_P in correspondence to the data input command DIN_CMD. First and fifth data D0 and D4 and first additional data AD0 are latched by the third latch signal DQS<2>.

The ringback latch signal generation block 850 activates the second period signal NB from a time when the input start signal DIN_START is latched by the third latch signal DQS<2> to until the fourth latch signal DQS<3> is activated after the first latch signal DQS<0> is activated 2 times, and transfers the second and fourth latch signals DQS<1> and DQS<3> as the first and second ringback latch signals RB_DQS<0:1> during the period in which the second period signal NB is activated.

The first data latch block 860 latches third and fourth data D2 and D3 and seventh and eighth data D6 and D7 in response to the first and second latch signals DQS<0:1> and outputs the latched data to the first and second output terminals OUT<0:1> in alignment with the second latch signal DQS<1>. The data latch block 860 latches first and second data D0 and D1 fifth and sixth data D4 and D5 and first and second additional data AD0 and AD1 in response to the third and fourth latch signals DQS<2:3>, and outputs the latched data to the third and fourth output terminals OUT<2:3> in alignment with the fourth latch signal DQS<3>.

Since the input start signal DIN_START is latched by the third latch signal DQS<2> as indicated by the arrow A4, the correspondence signal COR has the second value, for example, a low logic level. A first last latch signal LAST_LAT<0> is transferred as a second transfer signal TRANS<1> when the 8 data D0 to D7 are inputted, and a second last latch signal LAST_LAT<1> is transferred as a fourth transfer signal TRANS<3> when the additional data AD0 and AD1 are inputted. Accordingly, in the former case, the data RB_OUTD<2>, RB_OUTD<3>, RB_OUTD<0> and RB_OUTD<1> are respectively transferred to the first to fourth data transfer lines DL<0:3>, and in the latter case, the data RB_OUTD<2> and RB_OUTD<3> are respectively transferred to the first and second additional data transfer lines ADL<0:1>.

According to the embodiment of the present invention, since the data inputted in series are aligned in parallel and are transferred to data transfer lines, by using a data strobe signal, a jitter may be decreased and a setup/hold margin may be increased.

According to the embodiment of the present invention, since the latch signals generated using the data strobe signal are caused to only toggle during periods in which data are inputted, through ring-back control it may be possible to substantially prevent invalid data from being transferred, even when noise is generated in the data strobe signal.

Although various embodiments of the present invention have been described for illustrative purposes, it will be apparent to those skilled in the art that various changes and modifications may be made without departing from the spirit and scope of the invention as defined in the following claims.

What is claimed is:

1. A semiconductor device comprising:
   a first buffer suitable for receiving and buffering data;
   a second buffer suitable for receiving and buffering a data strobe signal;
   a strobe line suitable for transferring the data strobe signal;
   a plurality of data transfer lines suitable for transferring data inputted at corresponding turns among data inputted in series through the first buffer;
   a latch signal generation block suitable for generating a plurality of latch signals which are sequentially activated, based on the data strobe signal transferred through the strobe line;
   a data latch block suitable for latching and aligning in parallel the data inputted in series through the first buffer, based on the latch signals; and
   a data transfer block suitable for transferring the data latched by the data latch block to the plurality of data transfer lines, according to a correspondence relationship determined based on an input start signal that is activated at a time when the input of data corresponding to the data input command is started.

2. The semiconductor device according to claim 1, wherein the data latch block includes a plurality of output terminals, which correspond to the respective latch signals, and outputs data latched by the latch signals to the corresponding output terminals.

3. The semiconductor device according to claim 1, wherein the data transfer block aligns in parallel the data outputted from the data latch block, based on a time when finally latched data among the data latched by the data latch block is latched.

4. The semiconductor device according to claim 1, wherein the data transfer block transfers data of the output terminals to the data transfer lines, according to the correspondence relationship that is determined based on the input start signal.

5. The semiconductor device according to claim 4,
wherein the data transfer lines include first to fourth data transfer lines, and
wherein the latch signal generation block generates a first latch signal which is synchronized with a first rising edge of the data strobe signal outputted from the second buffer, a second latch signal which is synchronized with a first falling edge of the data strobe signal, a third latch signal which is synchronized with a second rising edge of the data strobe signal, and a fourth latch signal which is synchronized with a second falling edge of the data strobe signal.

6. The semiconductor device according to claim 5, wherein the data latch block includes:
a first latch unit suitable for latching data based on the first latch signal, and outputting the data latched therein to a first output terminal in alignment with the second latch signal;
a second latch unit suitable for latching data based on the second latch signal, and outputting the data latched therein to a second output terminal;
a third latch unit suitable for latching data based on the third latch signal, and outputting the data latched therein to a third output terminal in alignment with the fourth latch signal; and
a fourth latch unit suitable for latching data based on the fourth latch signal, and outputting latched data to a fourth output terminal.

7. The semiconductor device according to claim 6, wherein the data transfer block includes:
a correspondence signal generation unit suitable for generating a correspondence signal which has a first logic value when the input start signal is latched by the first latch signal and a second logic value when the input start signal is latched by the third latch signal;
an alignment unit suitable for aligning data of the first to fourth output terminals in synchronization with the second latch signal and the fourth latch signal; and
a transfer unit suitable for transferring the data of the first to fourth output terminals to the first to fourth data transfer lines, respectively, when the correspondence signal has the first logic value, and transferring the data of the first to fourth output terminals to the third and fourth data transfer lines and the first and second data transfer lines, respectively, when the correspondence signal has the second logic value.

8. The semiconductor device according to claim 7,
wherein the data transfer lines further include first and second additional data transfer lines, and
wherein the transfer unit transfers the data of the first and second output terminals to the first and second additional data transfer lines when the correspondence signal has the first logic value, and transfers the data of the third and fourth output terminals to the first and second additional data transfer lines when the correspondence signal has the second logic value.

9. The semiconductor device according to claim 8,
wherein the transfer unit includes:
a transfer signal generation section suitable for transferring a first last latch signal and a second last latch signal as a first transfer signal and a third transfer signal, when the correspondence signal has the first logic value, and transferring the first last latch signal and the second last latch signal as a second transfer signal and a fourth transfer signal, when the correspondence signal has the second logic value, and
wherein the first last latch signal is activated when the finally latched data is latched, and the second last latch signal is activated when finally latched additional data among additional data latched by the data latch block is latched.

10. The semiconductor device according to claim 9, wherein the transfer unit further includes:
an internal transfer section suitable for transferring the data from the first to fourth output terminals to the first to fourth data transfer lines, respectively, when the first transfer signal is activated, transferring the data from the first to fourth output terminals to the third and fourth data transfer lines and the first and second data transfer lines, respectively, when the second transfer signal is activated, transferring the data from the first and second output terminals to the first and second additional data transfer lines, respectively, when the third transfer signal is activated, and transferring the data from the third and fourth output terminals to the first and second additional data transfer lines, respectively, when the fourth transfer signal is activated.

11. The semiconductor device according to claim 10, further comprising:
an internal circuit suitable for performing a predetermined operation based on the data transferred through the data transfer block, in synchronization with a clock signal,
wherein the data input command includes a write command, and the first and second additional data include cyclic redundancy check data.

12. A semiconductor device comprising:
a first buffer suitable for receiving and buffering data;
a second buffer suitable for receiving and buffering a data strobe signal;
a strobe line suitable for transferring the data strobe signal;
a plurality of data transfer lines suitable for transferring data inputted at corresponding turns among data inputted in series through the first buffer;
a latch signal generation block suitable for generating a plurality of latch signals, which are sequentially activated, by using the data strobe signal transferred through the strobe line;
a ringback latch signal generation block suitable for generating at least one ringback latch signal', which is activated during a period corresponding to a time during which data corresponding to a data input command is inputted, based on at least one latch signal among the latch signals;
a first data latch block suitable for latching and aligning in parallel the data inputted in series through the first buffer, based on the latch signals;
a second data latch block suitable for latching data outputted from the first data latch block, based on the at least one ringback latch signal; and
a data transfer block suitable for transferring the data latched by the second data latch block, to a plurality of data transfer lines, according to a correspondence relationship determined based on an input start signal that is activated at a time when the input of data corresponding to the data input command is started.

13. The semiconductor device according to claim 12,
wherein the first data latch block includes a plurality of output terminals which respectively correspond to the latch signals, and outputs data latched by the latch signals, to the output terminals which correspond to the latch signals, and
wherein the second data latch block includes a plurality of ringback output terminals which respectively correspond to the output terminals, and outputs data latched by the at least one ringback latch signal, to ringback output terminals which correspond to the output terminals.

14. The semiconductor device according to claim 12, wherein the data transfer block aligns in parallel the data outputted from the second data latch block, based on a time when finally latched data among the data latched by the second data latch block is latched.

15. The semiconductor device according to claim 12, wherein the data transfer block transfers data from the ringback output terminals to the data transfer lines, according to the correspondence relationship that is determined in response to the input start signal.

16. The semiconductor device according to claim 12,
wherein the data transfer lines include first to fourth data transfer lines,
wherein the latch signal generation block generates a first latch signal which is synchronized with a first rising edge of the data strobe signal outputted from the second buffer, a second latch signal which is synchronized with a first falling edge of the data strobe signal, a third latch signal which is synchronized with a second rising edge of the data strobe signal, and a fourth latch signal which is synchronized with a second falling edge of the data strobe signal, and
wherein the ringback latch signal generation block generates first and second ringback latch signals, transfers the second and fourth latch signals as the first and second ringback latch signals, respectively, from a time when the input start signal is activated to until the fourth latch signal is activated after the third latch signal is activated a predetermined number of times when the input start signal is latched by the first latch signal, and transfers the second and fourth latch signals as the first and second ringback latch signals, respectively, from a time when the input start signal is activated to until the second latch signal is activated after the first latch signal is activated a predetermined number of times when the input start signal is latched by the third latch signal.

17. The semiconductor device according to claim 16,
wherein the first data latch block includes:
a first latch unit suitable for latching data based on the first latch signal, and outputting the data latched therein to a first output terminal in alignment with the second latch signal;
a second latch unit suitable for latching data based on the second latch signal, and outputting the data latched therein to a second output terminal;
a third latch unit suitable for latching data based on the third latch signal, and outputting the data latched therein to a third output terminal in alignment with the fourth latch signal; and
a fourth latch unit suitable for latching data based on the fourth latch signal, and outputting the data latched therein to a fourth output terminal.

18. The semiconductor device according to claim 17, wherein the second data latch block includes:
a first ringback latch unit suitable for latching data of the first output terminal based on the first ringback latch signal, and outputting the data latched therein to a first ringback output terminal;
a second ringback latch unit suitable for latching data of the second output terminal based on the first ringback latch signal, and outputting the data latched therein to a second ringback output terminal;
a third ringback latch unit suitable for latching data of the third output terminal based on the second ringback latch signal, and outputting the data latched therein to a third ringback output terminal; and
a fourth ringback latch unit suitable for latching data of the fourth output terminal based on the second ringback latch signal, and outputting the data latched therein to a fourth ringback output terminal.

19. The semiconductor device according to claim 18, wherein the data transfer block includes:
a correspondence signal generation unit suitable for generating a correspondence signal which has a first logic value when the input start signal is latched by the first latch signal and a second logic value when the input start signal is latched by the third latch signal;
an alignment unit suitable for aligning data of the first to fourth ringback output terminals in synchronization with the first ringback latch signal and the second ringback latch signal; and
a transfer unit suitable for transferring the data from the first to fourth ringback output terminals to the first to fourth data transfer lines, respectively, when the correspondence signal has the first logic value, and transferring the data from the first to fourth ringback output terminals to the third and fourth data transfer lines and the first and second data transfer lines, respectively, when the correspondence signal has the second logic value.

20. The semiconductor device according to claim 19,
wherein the data transfer lines further include first and second additional data transfer lines,
wherein the transfer unit transfers the data from the first and second ringback output terminals to the first and second additional data transfer lines when the correspondence signal has the first logic value, and transfers the data from the third and fourth ringback output terminals to the first and second additional data transfer lines when the correspondence signal has the second logic value, and
wherein the ringback latch signal generation block generates first and second ringback latch signals and when the input start signal is latched by the first latch signal transfers the second and fourth latch signals as the first and second ringback latch signals, respectively, from a time when the input start signal is activated to until the second latch signal is activated after the third latch signal is activated a predetermined number of times, and when the input start signal is latched by the third latch signal transfers the second and fourth latch signals as the first and second ringback latch signals, respectively, from a time when the input start signal is activated to until the fourth latch signal is activated after the first latch signal is activated a predetermined number of times.

21. The semiconductor device according to claim 20,
wherein the transfer unit includes:
a transfer signal generation section suitable for transferring a first last latch signal and a second last latch signal as a first transfer signal and a third transfer signal, when the correspondence signal has the first logic value, and transferring the first last latch signal and the second last latch signal as a second transfer signal and a fourth transfer signal, when the correspondence signal has the second logic value, and wherein the first last latch signal is activated when the finally latched data is latched, and the second last latch signal is activated when finally latched additional data among additional data latched by the first data latch block is latched.

22. The semiconductor device according to claim 21, wherein the transfer unit further includes:

an internal transfer section suitable for transferring the data from the first to fourth ringback output terminals to the first to fourth data transfer lines, respectively, when the first transfer signal is activated, transferring the data from the first to fourth ringback output terminals to the third and fourth data transfer lines and the first and second data transfer lines, respectively, when the second transfer signal is activated, transferring the data from the first and second ringback output terminals to the first and second additional data transfer lines, respectively, when the third transfer signal is activated, and transferring the data from the third and fourth ringback output terminals to the first and second additional data transfer lines, respectively, when the fourth transfer signal is activated.

23. The semiconductor device according to claim 12, further comprising:

an internal circuit suitable for performing a predetermined operation based on the data transferred through the data transfer block, in synchronization with a clock signal, wherein the data input command includes a write command, and the first and second additional data include cyclic redundancy check data.

* * * * *